United States Patent
Arai et al.

(10) Patent No.: US 9,406,887 B2
(45) Date of Patent: Aug. 2, 2016

(54) SOLUTION, ORGANIC SEMICONDUCTOR MATERIAL, ORGANIC SEMICONDUCTOR FILM, ELECTRONIC DEVICE AND ELECTRONIC EQUIPMENT

(71) Applicants: Ryota Arai, Shizuoka (JP); Yoshiki Yanagawa, Shizuoka (JP)

(72) Inventors: Ryota Arai, Shizuoka (JP); Yoshiki Yanagawa, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 160 days.

(21) Appl. No.: 14/193,103

(22) Filed: Feb. 28, 2014

(65) Prior Publication Data

US 2014/0264184 A1 Sep. 18, 2014

(30) Foreign Application Priority Data

Mar. 14, 2013 (JP) ................................ 2013-052513

(51) Int. Cl.
*H01L 51/00* (2006.01)
*C08G 61/12* (2006.01)

(52) U.S. Cl.
CPC .......... *H01L 51/0036* (2013.01); *C08G 61/124* (2013.01); *C08G 61/126* (2013.01); *H01L51/0053* (2013.01); *H01L 51/0068* (2013.01); *C08G 2261/1426* (2013.01); *C08G 2261/3223* (2013.01); *C08G 2261/344* (2013.01); *Y02E 10/549* (2013.01)

(58) Field of Classification Search
CPC ............ H01L 51/0036; H01L 51/0053; H01L 51/0068; C08G 61/124; C08G 61/126; C08G 2261/1426; C08G 2261/3223; C08G 2261/344; Y02E 10/549
USPC .............................. 252/500; 542/548; 526/256
See application file for complete search history.

(56) References Cited

U.S. PATENT DOCUMENTS

| | | | |
|---|---|---|---|
| 2010/0193777 A1* | 8/2010 | Takahashi .............. | B82Y 10/00 257/40 |
| 2010/0326525 A1* | 12/2010 | Nguyen ................. | B82Y 10/00 136/263 |
| 2013/0095605 A1 | 4/2013 | Goto et al. | |

FOREIGN PATENT DOCUMENTS

| | | |
|---|---|---|
| JP | 2007-026930 | 2/2007 |
| JP | 2008-226959 | 9/2008 |
| JP | 2011-501793 | 1/2011 |
| JP | 2012-020987 | 2/2012 |
| WO | WO2009/047104 A2 | 4/2009 |

OTHER PUBLICATIONS

Lee et al. "Inversion of Dominant Polarity in Ambipolar Polydiketopyrrolopyrrole with Thermally Removable Groups". Jun. 12, 2012. Advanced Functional Materials. 2012, 22, 4128-4138. Total pp. 11.*

* cited by examiner

*Primary Examiner* — Mark Kopec
*Assistant Examiner* — Danny N Kang
(74) *Attorney, Agent, or Firm* — Cooper & Dunham LLP

(57) ABSTRACT

A solution includes an organic solvent and a compound dissolved in the organic solvent, having the following formula (1):

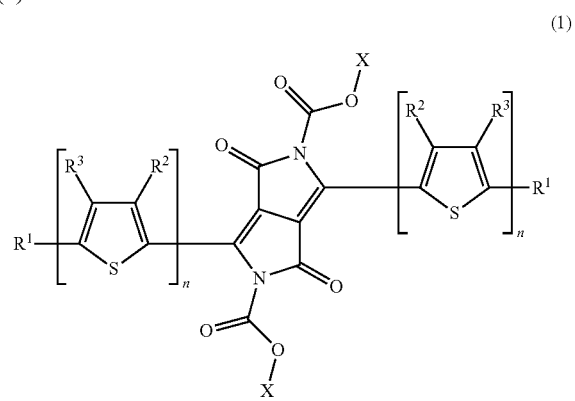

wherein $R^1$ represents an aromatic group which may have a substituent or an alkyl group which may have a substituent; $R^2$ and $R^3$ independently represent an alkyl group which may have a substituent, an alkoxy group which may have a substituent, an alkylthio group which may have a substituent or a hydrogen atom, and may form a ring together; X represents an alkyl group having 4 to 6 carbon atoms, which may have a substituent; and n represents 1, 2 or 3.

7 Claims, 9 Drawing Sheets

SOLUTION, ORGANIC SEMICONDUCTOR MATERIAL, ORGANIC SEMICONDUCTOR FILM, ELECTRONIC DEVICE AND ELECTRONIC EQUIPMENT

CROSS-REFERENCE TO RELATED APPLICATIONS

This patent application is based on and claims priority pursuant to 35 U.S.C. §119 to Japanese Patent Application No. 2013-052513, filed on Mar. 14, 2013, in the Japan Patent Office, the entire disclosure of which is hereby incorporated by reference herein.

BACKGROUND

1. Technical Field

The present invention relates to a solution, an organic semiconductor material, an organic semiconductor film, an electronic device and electronic equipment.

2. Description of the Related Art

Recently, studies and developments on organic semiconductors in sensors using organic semiconductive materials, organic LEDs, organic field-effect transistors and solar batteries.

Materials soluble inorganic solvents are known as the organic semiconductor materials because of being capable of forming a thin film by simple methods of wet process such as printing methods and spin coat methods.

The thin film can be formed on a plastic board having low heat resistance, and the weight and cost reduction of the electronic devices such as displays can be made. In addition, various applications taking advantage of flexibility of the plastic board.

Japanese published unexamined application No. JP-2011-501743-A discloses a diketopyrrolopyrrole derivative having the following formula.

However, even when the diketopyrrolopyrrole derivative is heated, —(N—$R^1$)— and —(N—$R^2$)— are unable to be substituted with an imino group (—NH—). Therefore, even when a solution of the diketopyrrolopyrrole derivative is used, an organic semiconductor film insoluble in an organic solvent cannot be formed.

Because of these reasons, a need exists for a solution capable of forming an organic semiconductor film insoluble in an organic solvent.

SUMMARY

Accordingly, one object of the present invention is to provide a solution capable of forming an organic semiconductor film insoluble in an organic solvent.

Another object of the present invention is to provide an organic semiconductor material.

A further object of the present invention is to provide an organic semiconductor film using the solution.

Another object of the present invention is to provide an electronic device using the organic semiconductor film.

A further object of the present invention is to provide electronic equipment using the electronic device.

These objects and other objects of the present invention, either individually or collectively, have been satisfied by the discovery of a solution, including an organic solvent; and a compound dissolved in the organic solvent, having the following formula (1):

(1)

wherein $R^1$ represents an aromatic group which may have a substituent or an alkyl group which may have a substituent; $R^2$ and $R^3$ independently represent an alkyl group which may have a substituent, an alkoxy group which may have a substituent, an alkylthio group which may have a substituent or a hydrogen atom, and may form a ring together; X represents an alkyl group having 4 to 6 carbon atoms, which may have a substituent; and n represents 1, 2 or 3.

These and other objects, features and advantages of the present invention will become apparent upon consideration of the following description of the preferred embodiments of the present invention taken in conjunction with the accompanying drawings.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION

Figure 1:
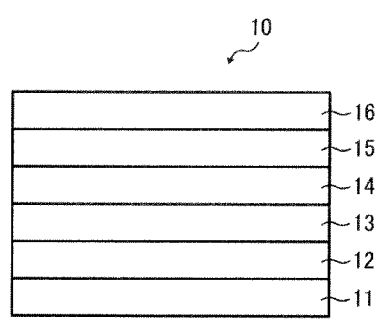
FIG. 1 is a schematic view illustrating a cross-section of an embodiment of a solar battery.

The present invention provides a solution capable of forming an organic semiconductor film insoluble in an organic solvent.

Particularly, the present invention relates to a solution, including an organic solvent; and a compound dissolved in the organic solvent, having the following formula (1): wherein $R^1$ represents an aromatic group which may have a substituent or an alkyl group which may have a substituent; $R^2$ and $R^3$ independently represent an alkyl group which may have a substituent, an alkoxy group which may have a substituent, an alkylthio group which may have a substituent or a hydrogen atom, and may form a ring together; X represents an alkyl group having 4 to 6 carbon atoms, which may have a substituent; and n represents 1, 2 or 3.

Being applied with an energy, the compound having the formula can be converted into a compound having the following formula (2):

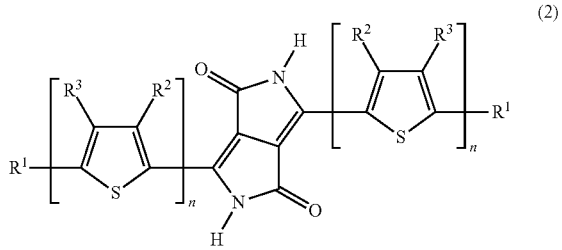

Having an imino group substituted with a group having the following formula (3), the compound having the formula (1) is soluble in an organic solvent.

Further, the group having the following formula (3) is eliminated from the compound having the formula (1) when applied with an energy to generate an imino group.

Alkyl group in each of $R^1$, $R^2$ and $R^3$ is a straight chain or a branched alkyl group having 1 to 30 carbon atoms, and may be a cycloalkyl group.

The alkyl group includes, but is not particularly limited to, a methyl group, an ethyl group, an n-propyl group, an isopropyl group, an n-butyl group, an isobutyl group, a tert-butyl group, a sec-butyl group, a 3-methylbutyl group, an n-pentyl group, an n-hexyl group, a 2-ethylhexyl group, an n-heptyl group, an n-octyl group, an n-nonyl group, an n-decyl group, an n-dodecyl group and an n-lauryl group.

The substituents of the alkyl group includes, but is not particularly limited to, alkyl groups having 1 to 12 carbons atoms such as a hydroxyl group, a methyl group, an ethyl group and, a tert-butyl group; alkoxy groups having 1 to 12 carbon atoms such as a methoxy group and an ethoxy group; aryl groups having 6 to 12 carbon atoms such as a phenyl group and a naphthyl group; aralkyl groups having 7 to 12 carbon atoms such as a benzyl group; acyl groups having 2 to 4 carbon atoms such as a glycidyl oxy group and an acetyl group; acyl oxy groups having 1 to 12 carbon atoms such as an acetyl oxy group; amino groups substituted with alkyl groups having 1 to 12 carbons atoms such as an amino group, a methyl amino group, an ethyl amino group and a dimethyl amino group; halogeno groups (halogen atom) such as a fluoro group (fluorine atom), a chloro group (chlorine atom) and bromo group (bromine atom); an oxo group (=O); and a carboxy group (—COOH).

The alkoxy group and the alkylthio group in each of $R^1$, $R^2$ and $R^3$ include, but are not particularly limited to, an alkoxy group and an alkylthio group which are alkyl groups the binding site of each of which an oxygen atom or a sulfuric atom is inserted into.

The alkyl group in the alkoxy group and the alkylthio group may be a branched alkyl group, but preferably a straight chain alkyl group because of possibly having an adverse affect on crystal packing.

The substituents of the alkoxy group and the alkylthio group are the same as those of the alkyl group.

The aromatic group in each of $R^1$, $R^2$ and $R^3$ include, but is not particularly limited to, a phenyl group, a naphthyl group and an anthryl group. Among these, the phenyl group is preferable.

The substituents of the aromatic group are the same as those of the alkyl group.

The alkyl group having 4 to 6 carbon atoms in X includes, but is not particularly limited to, a ter-butyl group, a sec-butyl group, an n-butyl group, an n-pentyl group, a 2-methyl-butyl group, an n-hexyl group, a 2-methyl-pentyl group, a 3-methyl-pentyl group, 2,2-dimethyl-butyl group and 2,3-dimethyl-butyl group.

The substituents of the alkyl group are the same as those of the above alkyl group.

n is preferably 1 or 2.

Being soluble is an organic solvent means a solubility of a material not less than 0.05% by weight when the organic solvent is cooled to have a temperature of 25° C. after heated to be refluxed.

The compound having the formula (1) has a solubility not less than 0.1% by weight, preferably not less than 0.5% by weight, and furthermore preferably not less than 1.0% by weight in an organic solvent when cooled to have a temperature of 25° C. after heated to be refluxed.

Solvents capable of dissolving the compound having the formula (1) include, but are not particularly limited to, THF, toluene, chloroform and methanol.

The compound having the formula (2) is insoluble in an organic solvent capable of dissolving the compound having the formula (1). When a coating liquid is applied on the compound having the formula (2), an organic solvent included in the coating liquid is difficult to invade the compound. Therefore, the compound having the formula (2) is effectively used to prepare an organic electronic devices such as an organic thin film transistor, an organic El and an organic solar battery.

Being insoluble is an organic solvent means a solubility of a material less than 0.01% by weight when the organic solvent is cooled to have a temperature of 25° C. after heated to be refluxed.

The compound having the formula (2) has a solubility not greater than 0.005% by weight, and preferably not greater than 0.001% by weight in an organic solvent when cooled to have a temperature of 25° C. after heated to be refluxed.

The compound having the formula (1) includes, but is not particularly limited to, the following compounds having the formulae (1-1) to (1-31):

(1-1) 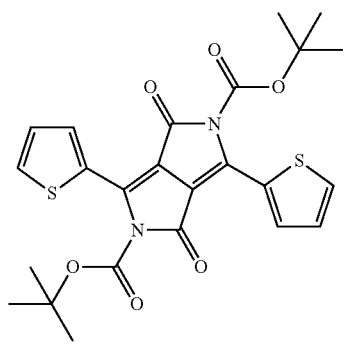
(1-2) 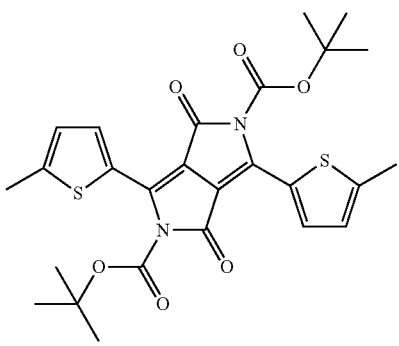
(1-3) 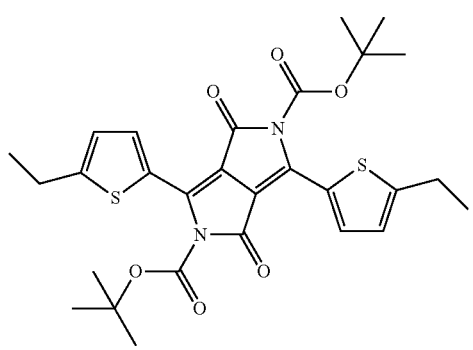
(1-4) 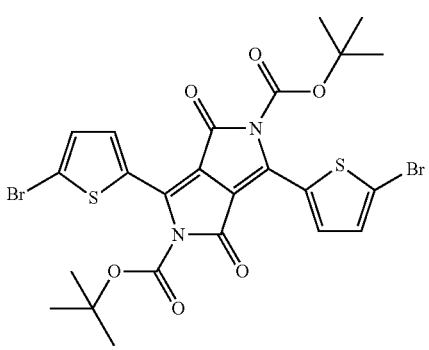
(1-5) 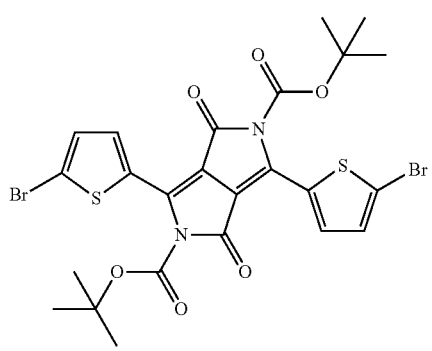
(1-6) 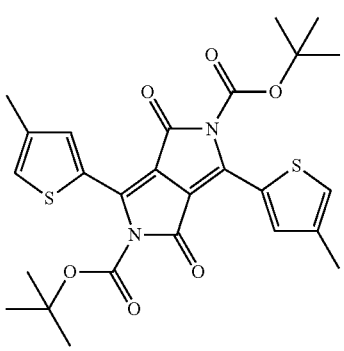
(1-7) 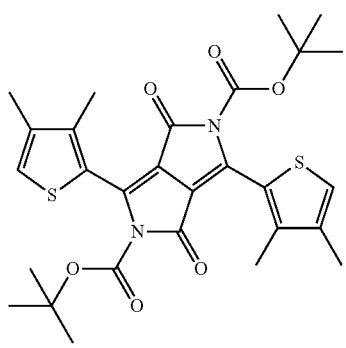
(1-8) 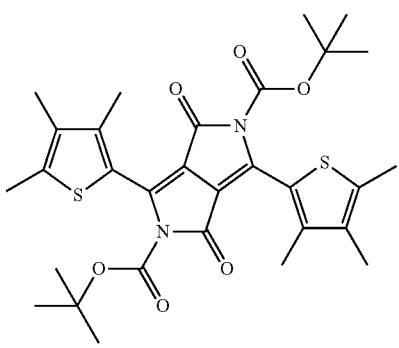

-continued
(1-9)
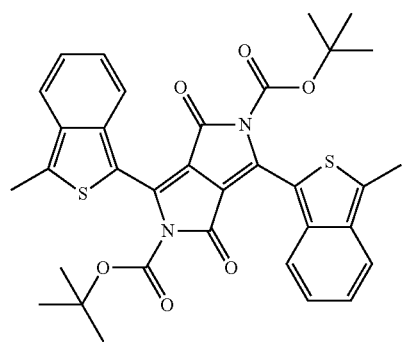
(1-10)
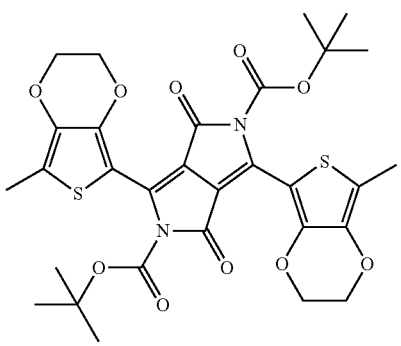
(1-11)
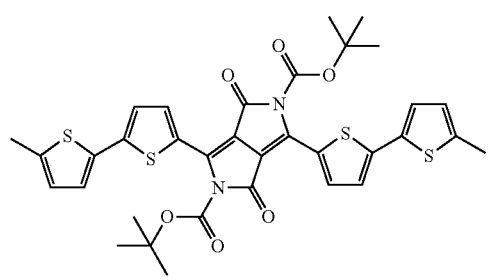
(1-12)
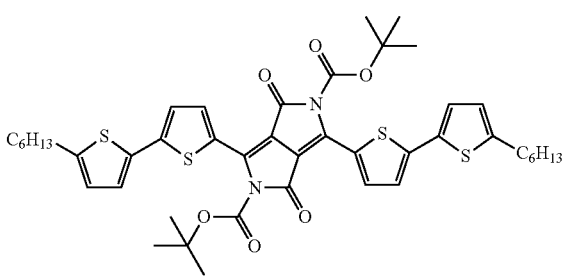
(1-13)
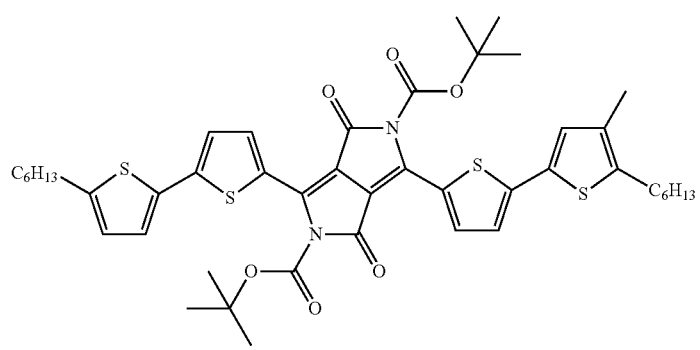
(1-14)
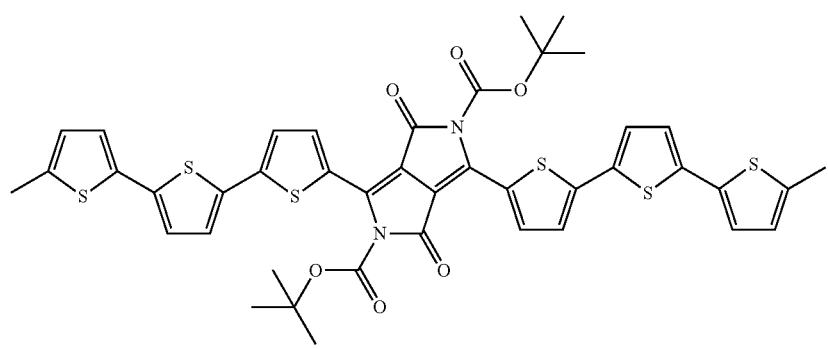

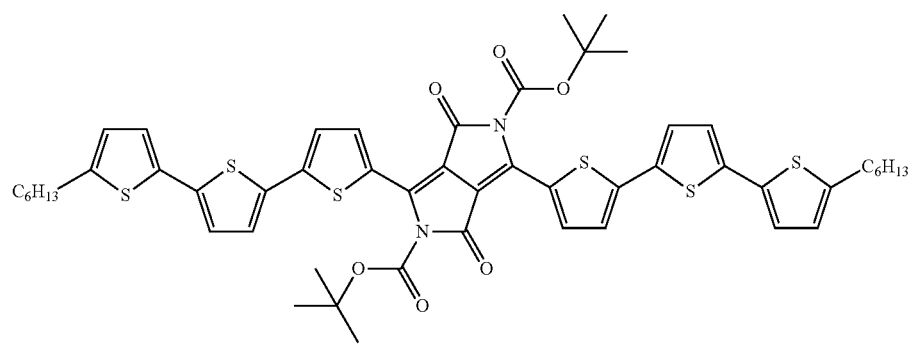
(1-15)
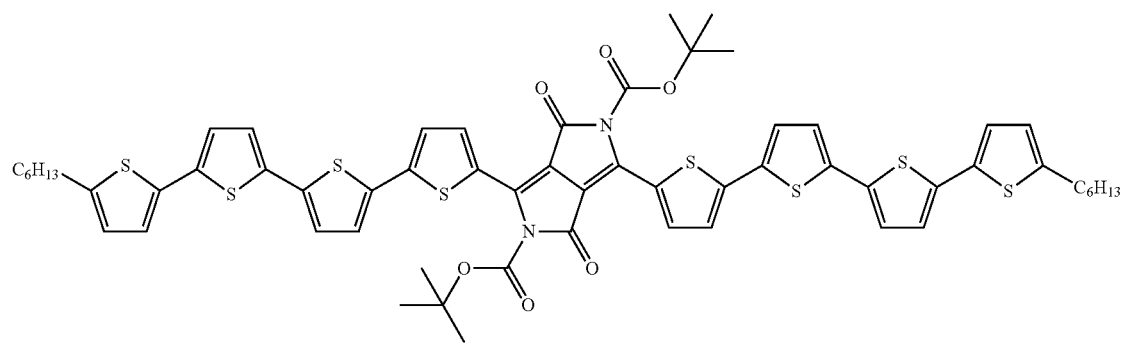
(1-16)
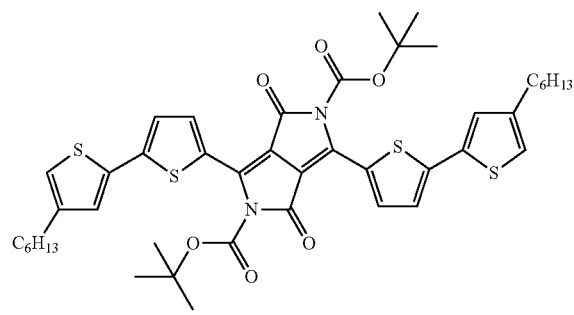
(1-17)
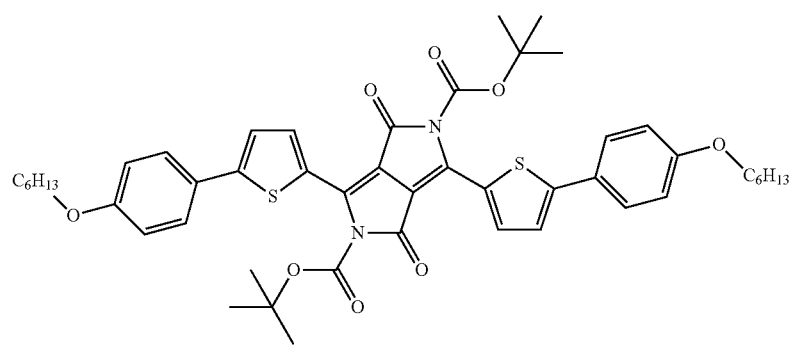
(1-18)

-continued
(1-19)
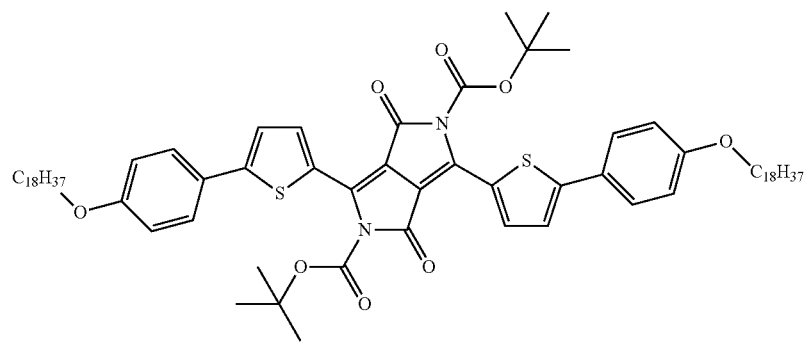
(1-20)
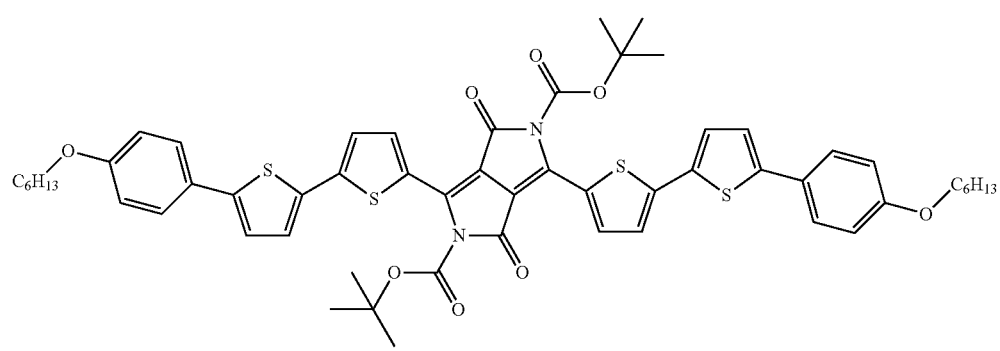
(1-21)
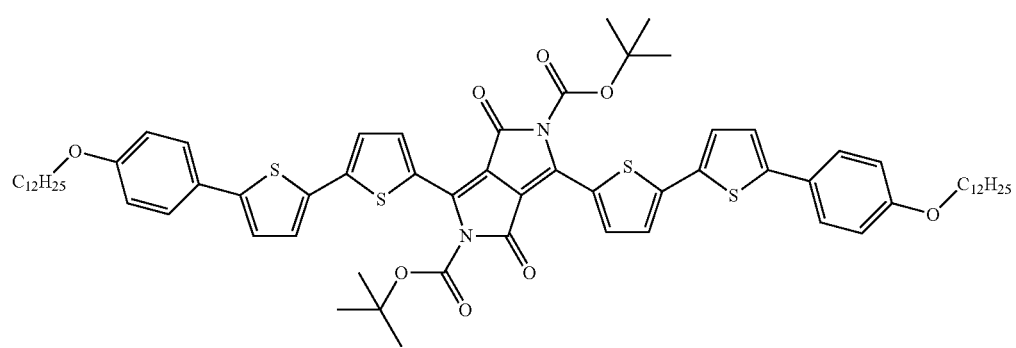
(1-22)
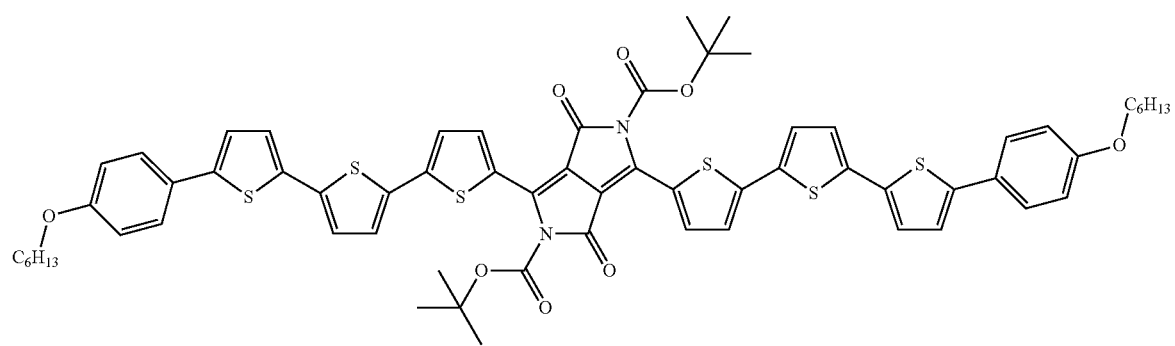

-continued
(1-23)
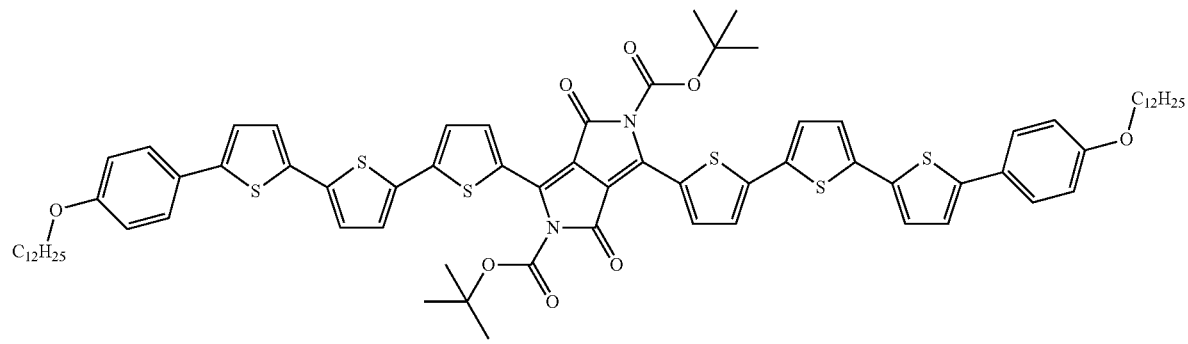
(1-24)
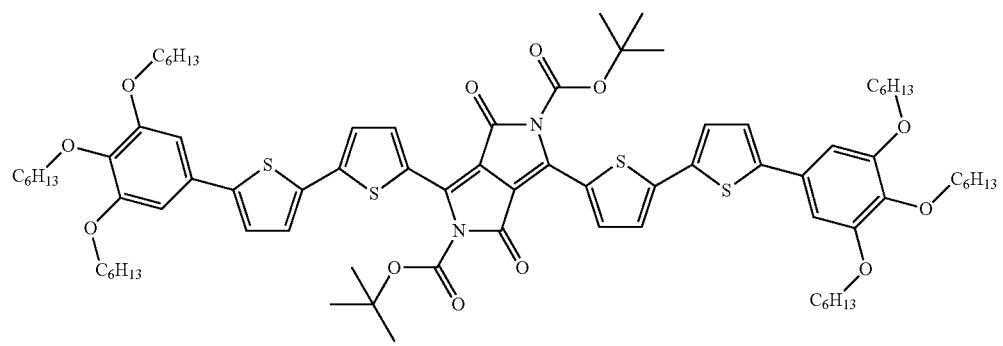
(1-25)
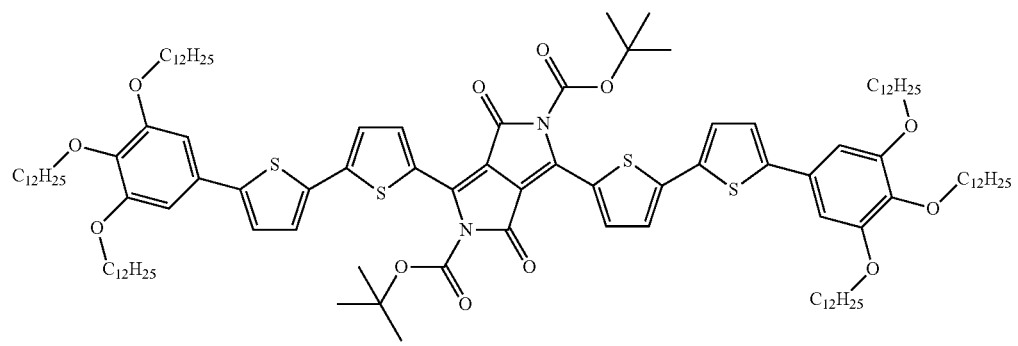
(1-26)
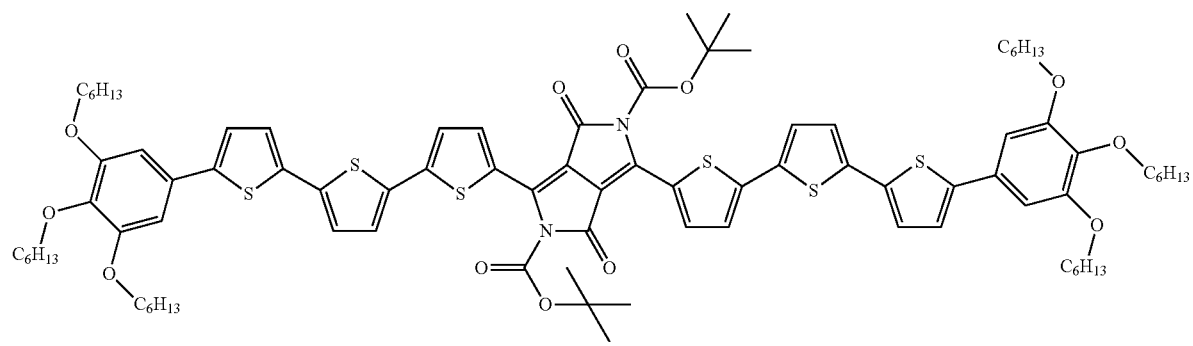

-continued
(1-27)
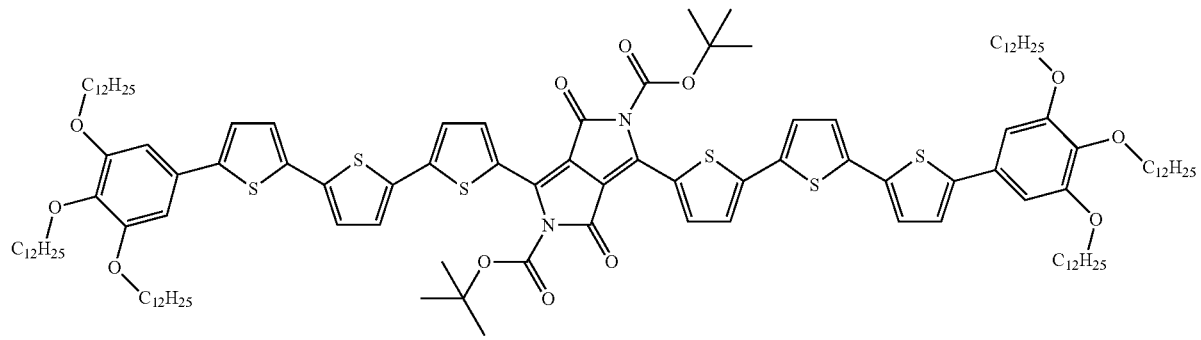
(1-28)
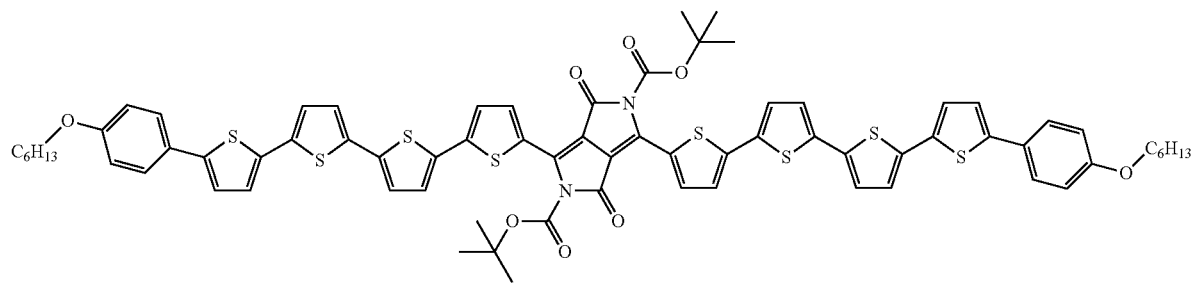
(1-29)
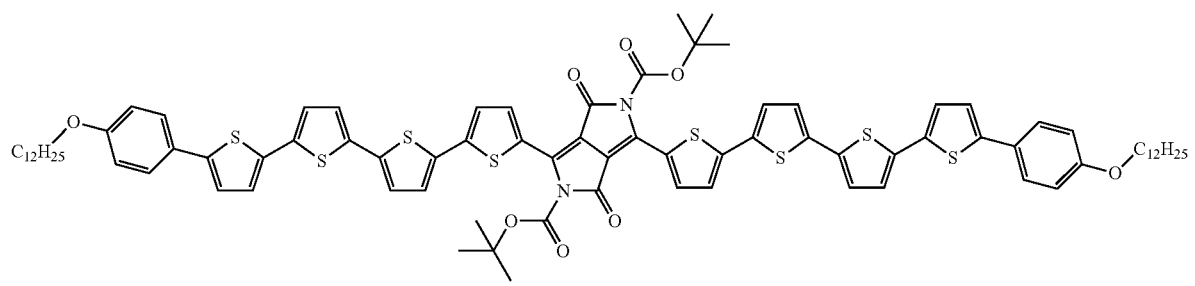
(1-30)
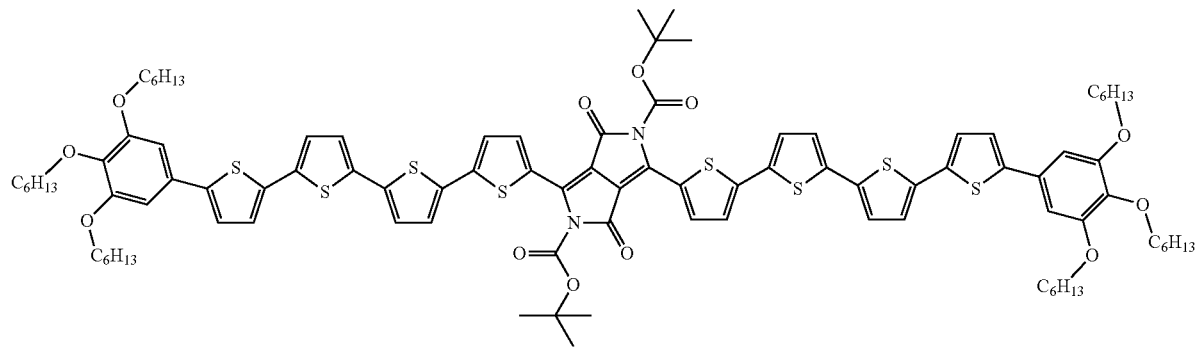

(1-31)
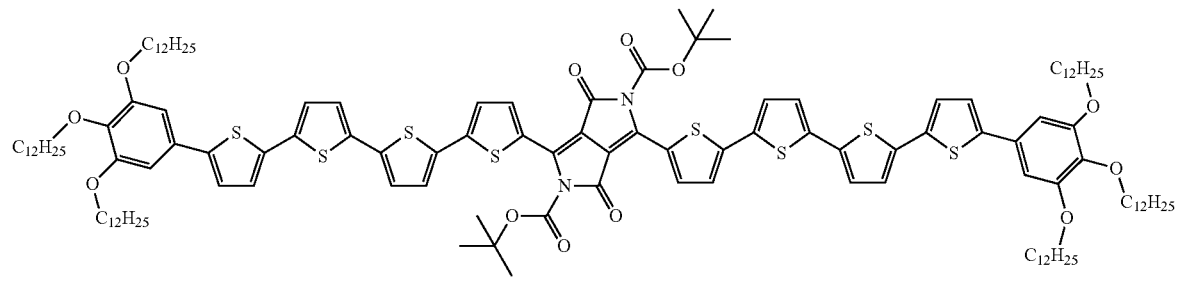
When an energy is applied to each of the compound having the formulae (1-1) to (1-31), they are converted into compounds having the following formulae (2-1) to (2-31), respectively.
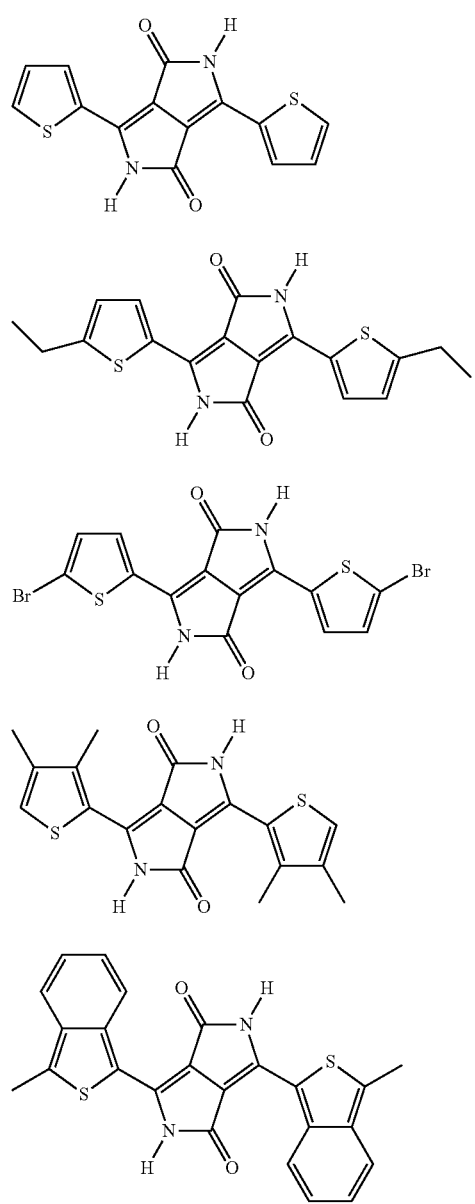
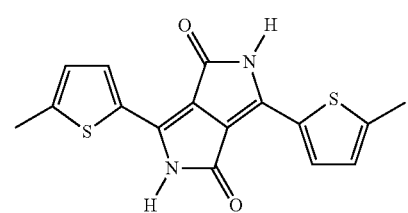
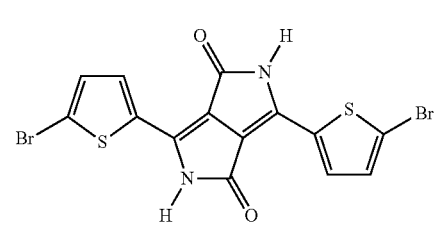
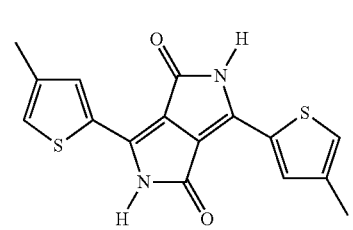
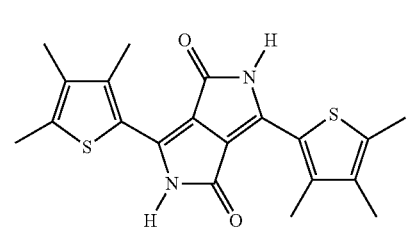
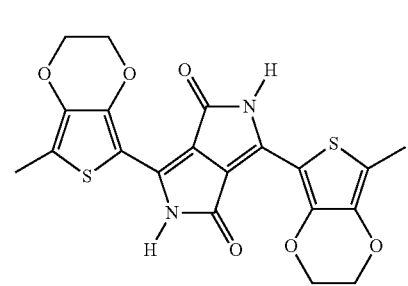

-continued
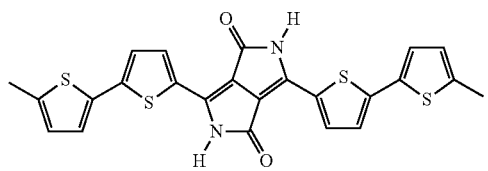
(2-11)
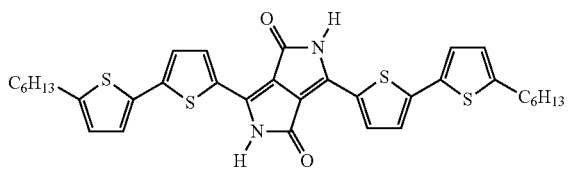
(2-12)
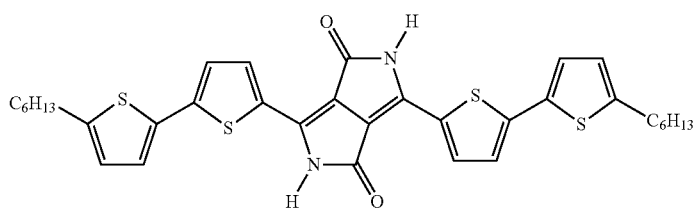
(2-13)
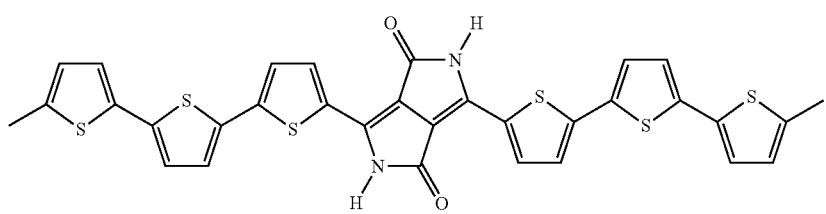
(2-14)
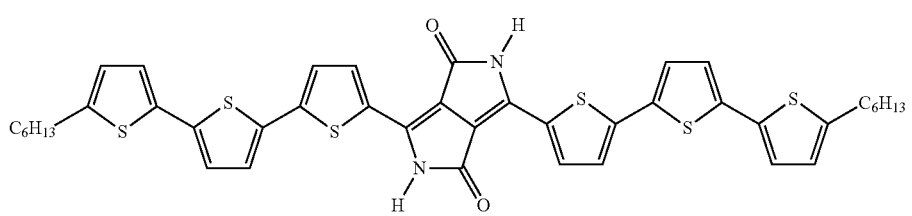
(2-15)
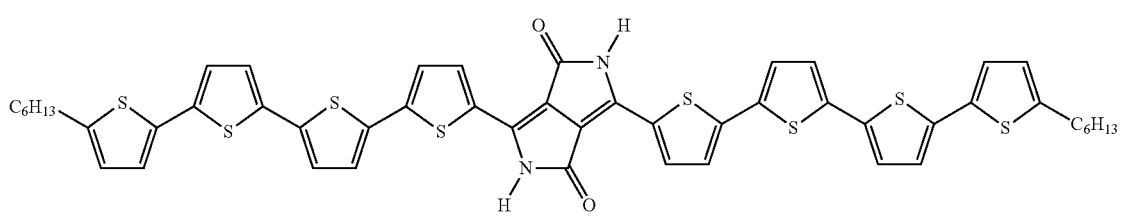
(2-16)
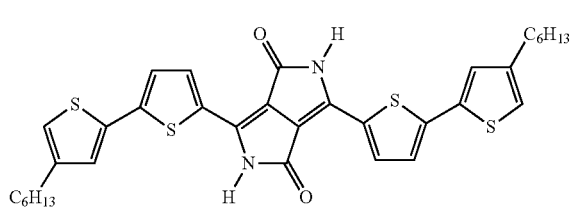
(2-17)
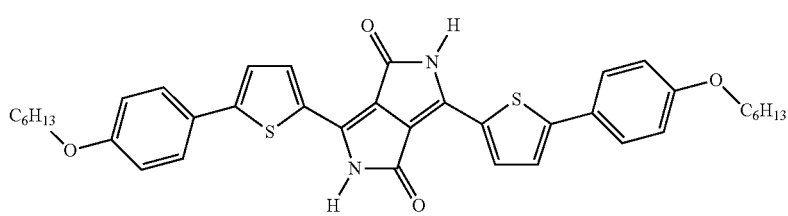
(2-18)

-continued
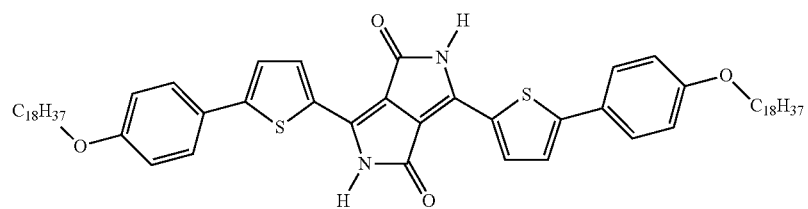
(2-19)
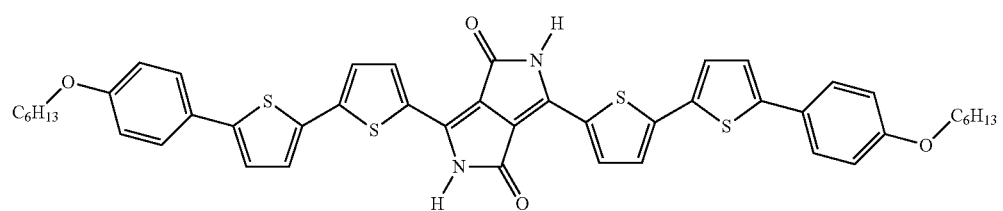
(2-20)
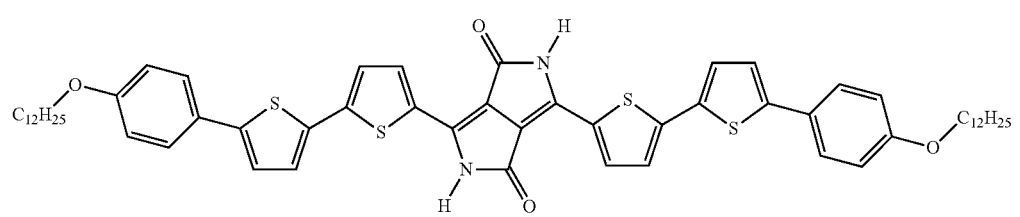
(2-21)
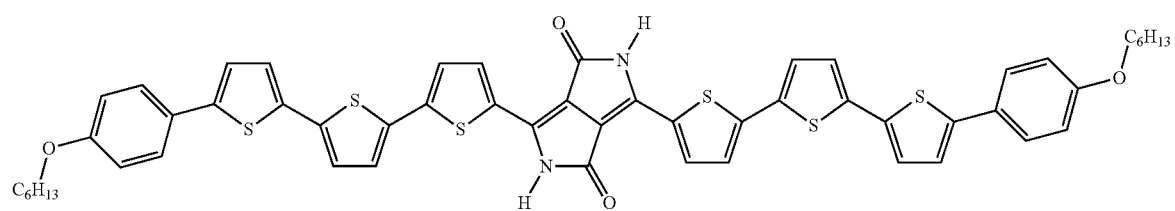
(2-22)
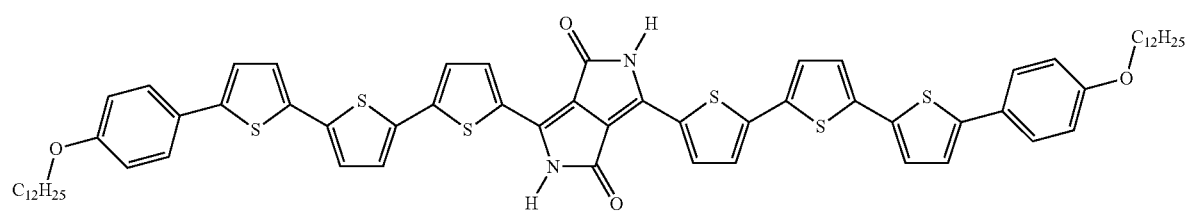
(2-23)
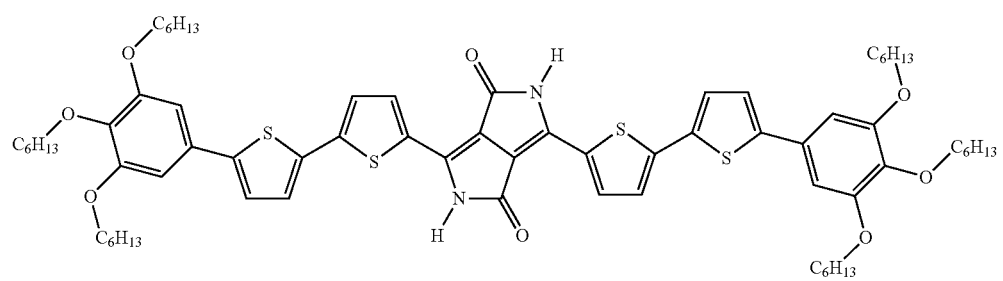
(2-24)

-continued
(2-25)
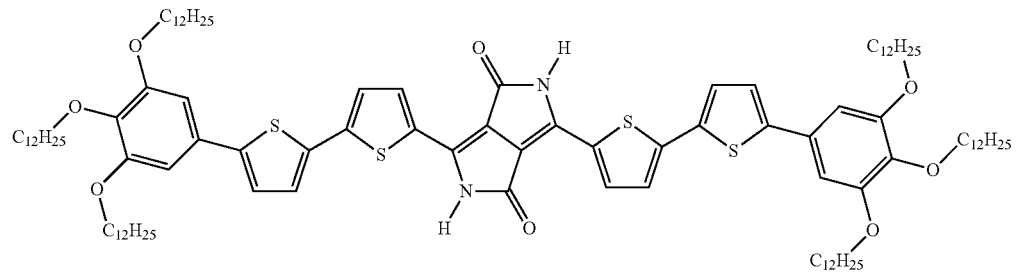
(2-26)
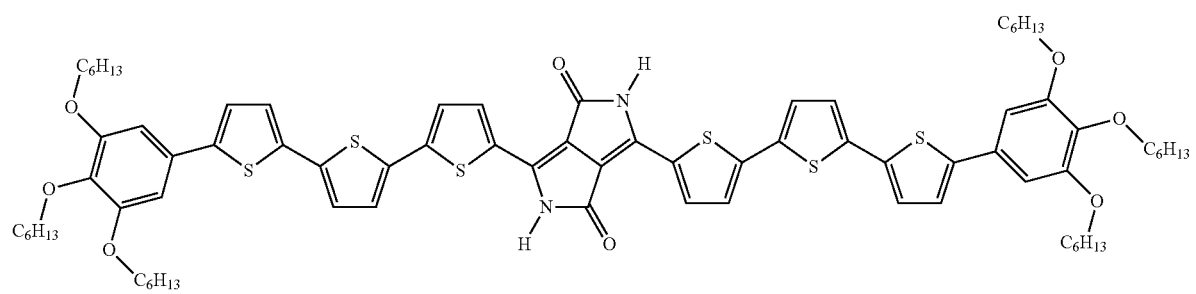
(2-27)
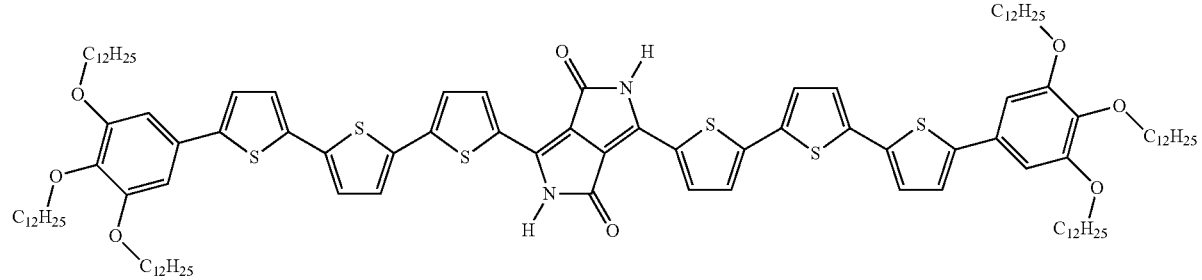
(2-28)
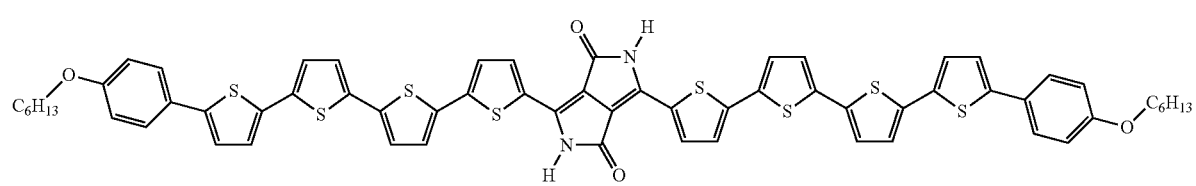
(2-29)
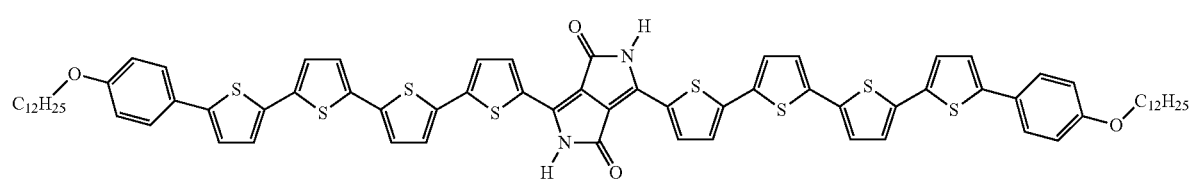
(2-30)
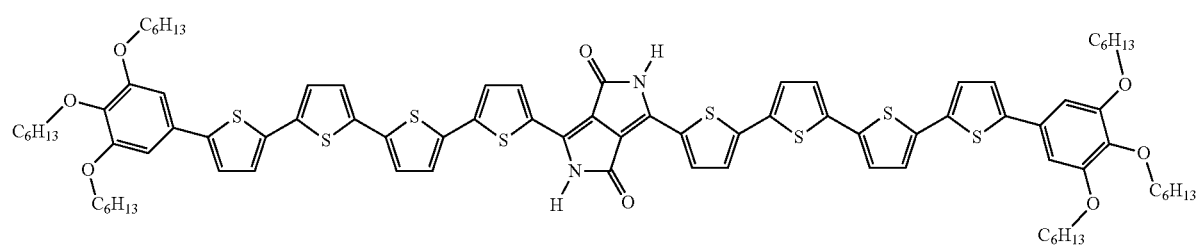

(2-31)

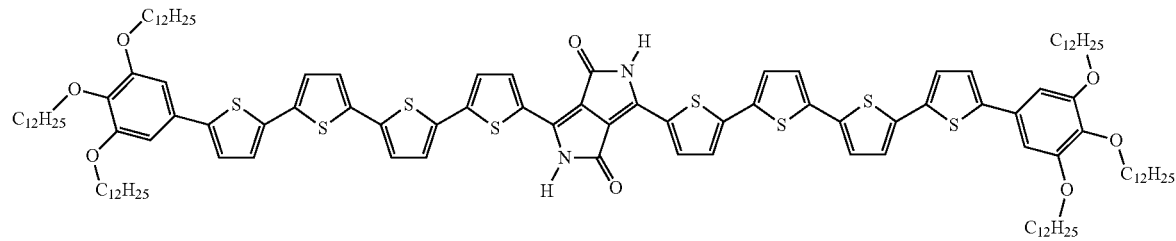

The group having the formula (3) is capable of producing a solid, a liquid and a gas when released. When it is removed from the reaction system, a liquid or a gas is preferable, and a gas at normal temperature and normal pressure or in an environment where the group having the formula (3) is released is more preferable.

The component the group having the formula (3) produces when released typically has a boiling point not higher than 500° C. at an atmospheric pressure (1013 hPa), preferably not higher than 300° C. in consideration of easiness of removal from the reaction system, and resolution and sublimation temperature of the produced π conjugated compound, and more preferably not higher than 200° C.

The following is an elimination reaction formula when X is a t-butyl group.

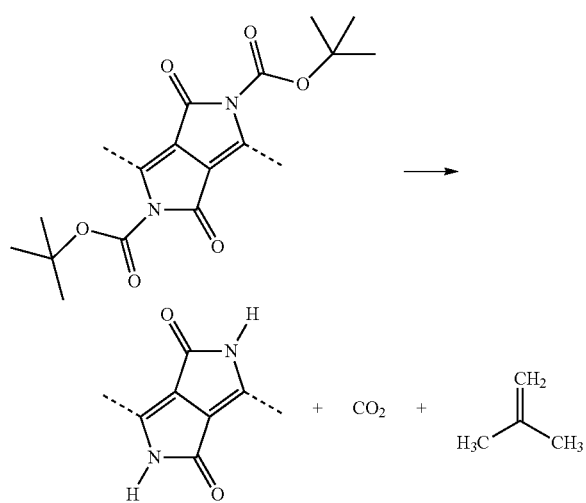

A t-butyloxycarbonyl group is eliminated from an N-(t-butyloxycarbonyl)diketopyrrolopyrrole derivative with heat to produce carbon dioxide and isobutene. Then, the carbon dioxide and the isobutene are gases at normal temperature and normal pressure, and are quickly exhausted from the reaction system.

The energy applied to the compound having the formula (1) includes, but not particularly limited to, heat, light and electromagnetic wave. Among these, heat or light is preferable in terms of reactivity, yield rate and after-treatment, and heat is more preferable.

Methods of heating the compound having the formula (1) include, but are not particularly limited to, a method of heating on a substrate, a method of heating in an oven, a method of heating by irradiating a microwave, a method of heating by converting light to heat with laser, and a method of heating with a light heat converting layer.

The temperature at which the compound having the formula (1) is heated is typically from 25 to 500° C., preferably from 40 to 500° C. in consideration of a boiling point of the component generated when the group having the formula (3) is eliminated, an energy efficiency, presence of the compound having the formula (1) and resolution and sublimation of the compound having the formula (2), more preferably from 60 to 500° C. in consideration of thermal stability of the compound having the formula (1), and furthermore preferably from 80 to 400° C.

Time for heating the compound having the formula (1) is typically from 0.5 to 120 min, preferably from 1 to 60 min, and more preferably from 1 to 30 min.

The light irradiated to the compound having the formula (1) includes, but is not particularly limited to, infrared and light absorbed by the compound having the formula (1) such as light having a wavelength not longer than 405 nm.

Then, the compound having the formula (1) may be irradiated with a laser beam by a semiconductor laser.

The laser beam includes, but is not particularly limited to, a near-infrared region laser beam (generally, a laser beam of wavelength around 780 nm), a visible laser beam (generally, a laser beam of wavelength in the range of 630 nm to 680 nm), and a laser beam of wavelength of 390 nm to 440 nm. Particularly preferable laser beam is a laser beam having a wavelength region of 390 nm to 440 nm is preferably used.

The semiconductor laser beam having an emission wavelength not longer than 440 nm includes a bluish-violet semiconductor laser beam having an emission wavelength region of 390 nm to 440 nm (more preferably from 390 nm to 415 nm), and a bluish-violet SHG laser beam having a center emission wavelength of 425 nm that has been converted to a half wavelength of the infrared semiconductor laser beam having a center emission wavelength of 850 nm by using an optical waveguide element.

Under the presence of an acid or a base, an energy may be applied to the compound having the formula (1). Since the acid or the base activates as a catalyst, the compound having the formula (1) can be converted into the compound having the formula (2) at low temperature.

A method of using the acid or base is not particularly limited. Examples of the method include a method in which the acid or the base may be directly added to compound having the formula (1), a method in which the acid or the base is dissolved in any solvent to form a solution, and the solution is added to the compound having the formula (1), a method in which the compound having the formula (1) is heated in the vaporized acid or the vaporized base, and a method in which a photoacid generator and a photobase generator are used, and followed by light irradiation. Among these, the method in which the compound having the formula (1) is heated in the vaporized acid or base is preferable because the acid or the base can easily be removed out of the reaction system.

Examples of the acids include, but are not particularly limited to, hydrochloric acid, nitric acid, sulfuric acid, acetic acid, trifluoroacetic acid, trifluoromethanesulfonic acid, 3,3,3-trifluoropropionic acid, formic acid, phosphoric acid and 2-butyl octanoic acid.

Examples of the photoacid generators include, but are not particularly limited to, ionic photoacid generators such as sulfonium salt, and an iodonium salt; and nonionic photoacid generators such as imide sulfonate, oxime sulfonate, disulfonyl diazomethane, and nitrobenzyl sulfonate.

Examples of the bases include, but are not particularly limited to, hydroxides such as sodium hydrate, potassium hydrate, carbonates such as sodium hydrogen carbonate, sodium carbonate, potassium carbonate, amines such as triethylamine and pyridine, and amidines such as diazabicycloundecene, diazabicyclononene.

Examples of photobase generators include, but are not particularly limited to, carbamates, acyloximes, and ammonium salts.

The compound having the formula (1) may be converted into the compound having the formula (2) in an ambient atmosphere, and which is preferably performed in an inert gas atmosphere (e.g., nitrogen or argon) or reduced pressure in order to reduce any influence of side reaction such as oxidation or influence of moisture, and to promote removal of a component produced by the elimination of the group having the formula (3) to the outside of the system.

Next, an example of methods of synthesizing the compound having the formula (1) is explained.

First, as the following reaction formula (1) shows, nitrile and disuccinate are reacted under e presence of a base to obtain the compound having the formula (2).

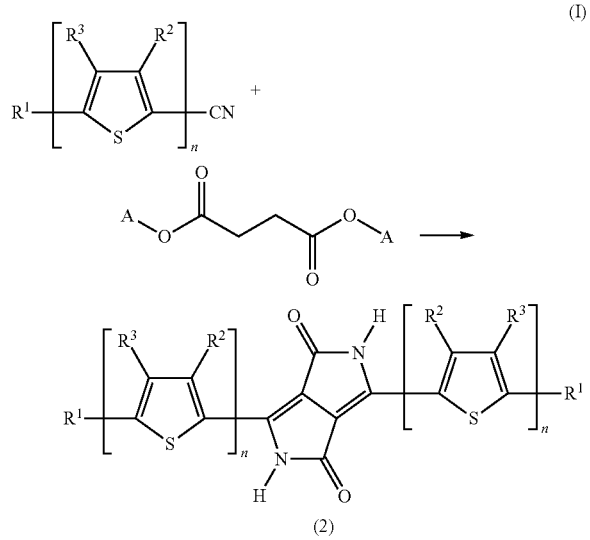

Next, as the following reaction formula (II) shows, the compound having the formula (2) is reacted with a dicarbonate compound to obtain the compound having the formula (1).

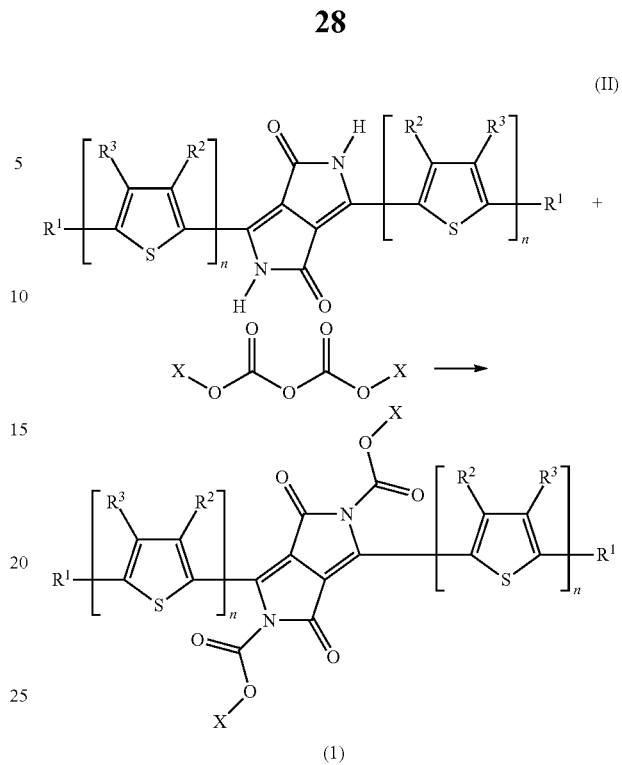

Next, another example of methods of synthesizing the compound having the formula (1) is explained.

First, as the following reaction formula (III) shows, nitrile and disuccinate are reacted under the presence of a base.

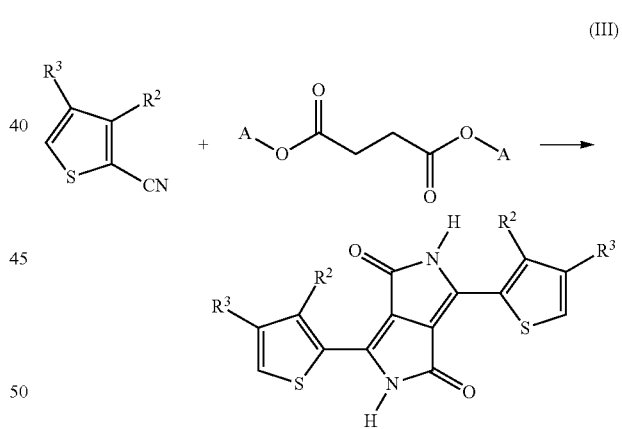

Next, as the following reaction formula (IV) shows, the reactant is reacted with a dicarbonate compound.

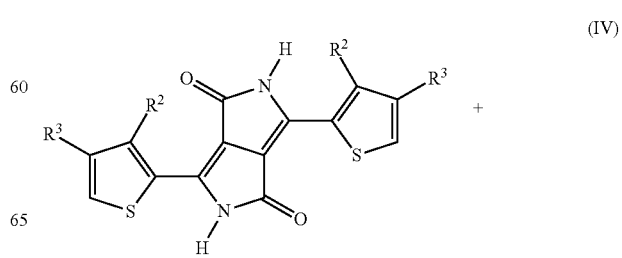

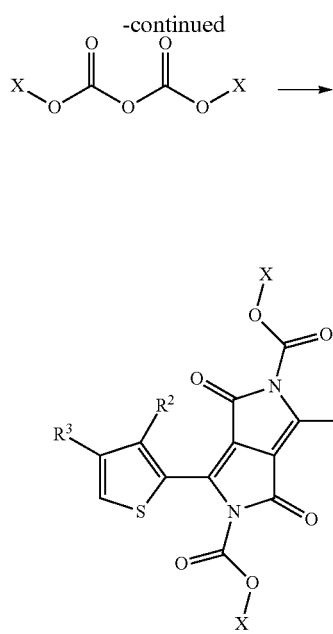

Further, as the following reaction formula (V) shows, the reactant is brominated with a bromination reagent.

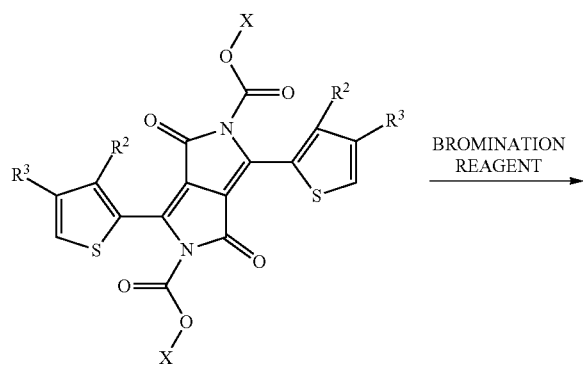

(V)

Next, as the following reaction formula (VI) shows, the reactant is subjected to a cross coupling reaction with a known metallic catalyst.

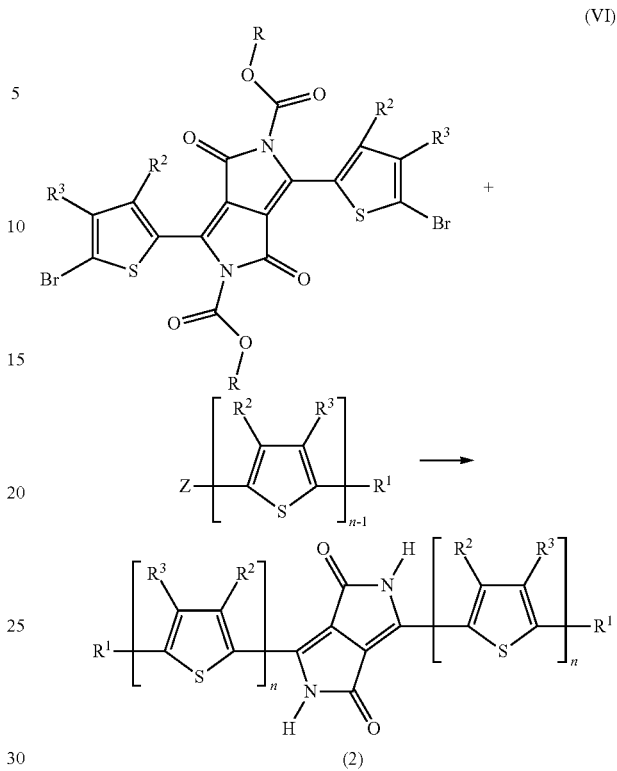

A on the formula (1) and (III) represents an alkyl group having 1 to 10 carbon atoms such as a methyl group, an ethyl group, a n-propyl group, an isopropyl group and a t-butyl group.

The bromination reagent in the formula (V) includes, but is not particularly limited to, a bromine atom and N-bromosuccinimide.

Z in the formula (VI) includes, but is not particularly limited to, groups derived from boronic acid such as groups having the following formulae:

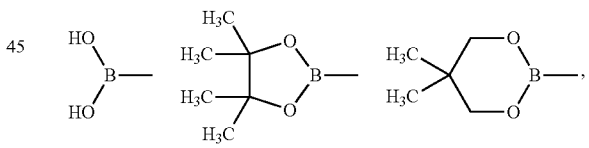

and groups derived from tin such as a group having the following formula:

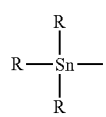

wherein R represents an alkyl group having 1 to 10 carbon atoms.

As an example of the cross coupling reaction using a metallic catalyst, Suzuki coupling reaction is explained.

The Suzuki coupling reaction is performed using halogenated aryl and an aryl boron compound.

A halogen atom of the halogenated aryl is preferably a boron atom or a bromine atom in terms of reactivity.

As the bromine atom, an aryl boronic acid, an aryl boronic acid ester or an aryl boronic acid salt is used. Among these, the aryl boronic acid ester is preferable because of not producing a trimerized anhydride (boroxine) as the aryl boronic acid, having high crystallinity and easily be refined.

Methods of synthesizing the aryl boronic acid ester include, but are not particularly limited to, a method of heating the aryl boronic acid and alkyl diol in an organic solvent anhydride, a method of adding alkoxy boron ester after metalizing a halogen site of an aryl halogenated material, a method of adding alkoxy boron ester after preparing a Grignard reagent, and a method of heating an aryl halogenated material and bis(pinacolato)diboron or bis(neopentylglycolato)diboron under a palladium catalyst.

Examples of the palladium catalysts used in the Suzuki coupling reaction include, but are not particularly limited to, $Pd(PPh_3)_4$, $PdCl_2(PPh_3)_2$, $Pd(OAc)_2$, $PdCl_2$, palladium carbon triphenylphosphine is separately added to as a ligand. Among these, $Pd(PPh_3)_4$ is typically used.

In the Suzuki coupling reaction, a base is necessary, and a relatively weak base, such as $Na_2CO_3$, or $NaHCO_3$ is preferable. In the case where steric hindrance effects on the reaction, a strong base such as $Ba(OH)_2$, $K_3PO_4$ or NaOH is effective. Additionally, caustic potash and metal alkoxides, such as potassium t-butoxide, sodium t-butoxide, lithium t-butoxide, potassium 2-methyl-2-butoxide, sodium 2-methyl-2-butoxide, sodium methoxide, sodium ethoxide, potassium ethoxide and potassium methoxide may be also used as the bases.

A phase transfer catalyst may be used to smoothly proceed the Suzuki coupling reaction.

Examples of the phase transfer catalyst include, but are not particularly limited to, tetra alkyl halogenated ammonium, tetra alkyl hydrogen sulfate ammonium and tetra alkyl ammonium hydroxide. Particularly, tetra-n-butyl halogenated ammonium or tricaprylylmethyl ammonium chloride is preferable.

The Suzuki coupling reaction may be performed in an ambient atmosphere, and which is preferably performed in an inert gas atmosphere (e.g., nitrogen or argon) because the catalyst used therein may be deteriorated.

Reaction solvents used in the reaction formulae (I) to (VI) include, but are not particularly limited to; alcohols and ethers such as methanol, ethanol, isopropanol, butanol, 2-methoxyethanol, 1,2-dimethoxyethane, bis(2-methoxyethyl)ether; halogen solvents such as chloroform, dichloromethane, 1,2-dichloroethane, carbon tetrachloride, chlorobenzene and 1,2-dichlorobenzene; and cyclic ethers such as dioxane and tetrahydrofuran; benzene; toluene; xylene; chlorobenzene; dichlorobenzene; dimethyl sulfoxide; N,N-dimethylformamide; N-methyl pyrrolidone; and 1,3-dimethyl-2-imidazolidinone.

The temperature in the reaction formulae (I) to (IV) and (VI) is typically from room temperature to 180° C., and preferably from room temperature to 100° C.

The temperature in the reaction formula (V) is typically from −50 to 50° C., and preferably from −10° C. to room temperature.

The compound having the formula (1) includes a diketopyrrolopyrrole skeleton and the group having the formula (3). Since the group having the formula (3) is bulky, the compound having the formula (1) has low crystallinity and is soluble in an organic solvent. Therefore, when a solution in which the compound having the formula (1) is dissolved in an organic solvent is coated, a film having low crystallinity or an amorphous film can be formed.

Methods of coating the solution in which the compound having the formula (1) is dissolved in an organic solvent include, but are not particularly limited to, an inkjet coating method, a spin coating method, a solution casting method, a dip coating method, a screen printing method and a gravure printing method.

Further, when an energy is applied to the film, the compound having the formula (1) is converted into the compound having the formula (2) to form a film including the compound having the formula (2). Namely, the solution in which the compound having the formula (1) is dissolved in an organic solvent can form an organic semiconductor film including the compound having the formula (2).

The organic semiconductor film can be used in an electronic device.

Examples of the electronic devices include, but are not particularly limited to, devices having two or more electrodes in which current and voltage between the electrodes are controlled by electricity, light, magnetism, chemical materials or the like; and apparatuses for generating light, electrical field, or magnetic field by application of voltage or current. Moreover, examples thereof include elements for controlling current or voltage by application of voltage or current, elements for controlling voltage or current by application of magnetic field, and elements for controlling voltage or current by action of a chemical material.

For control, rectification, switching, amplification, oscillation or the like are used.

Specific examples of the electronic devices include resistors, rectifiers (diode), switching elements (transistor, thyristor), amplifying elements (transistor), memory elements, chemical sensors or the like, combinations of these elements, integrated devices, or the like are exemplified. Additionally, solar batteries in which electromotive force generated by light, photodiodes for generating photocurrent, photoelements such as phototransistors, optical-electronic devices such as EL light emitters or the like are used.

The electronic devices can be used in electronic paper, various sensors, and radio frequency identification (RFID).

FIG. 1 is a schematic view illustrating a cross-section of an embodiment of a solar battery.

A solar battery 10 includes a transparent substrate 11, a positive electrode 12 overlying the transparent substrate 11, a positive hole extraction layer 13 overlying the positive electrode 12, a mixed layer 14 overlying the positive hole extraction layer 13, an electron extraction layer 15 overlying the mixed layer 14, and a negative electrode 16 overlying the electron extraction layer 15.

Materials forming the transparent substrate 11 include, but are not particularly limited to, a glass.

Materials forming the positive electrode 12 and the negative electrode 16 include, but are not particularly limited to, a metallic material.

Methods of forming the positive electrode 12 and the negative electrode 16 include, but are not particularly limited to, a vacuum evaporation method.

Materials forming the positive hole extraction layer 13 include, but are not particularly limited to, a p-type semiconductor material.

Methods of forming the positive hole extraction layer 13 include, but are not particularly limited to, a coating method.

When forming the positive hole extraction layer 13, it is preferably subjected to an anile treatment through an exposure to a solvent vapor in a solvent atmosphere or a heating.

The mixed layer 14 includes the compound having the formula (2), a p-type semiconductor material and a n-type semiconductor material.

A coating liquid in which the compound having the formula (1) is dissolved in an organic solvent, including a p-type semiconductor material, and a n-type semiconductor material is coated, and an energy is applied thereto to convert the compound having the formula (1) into the compound having the formula (2). Thus, the mixed layer 14 is formed.

When forming the mixed layer 14, it is preferably subjected to an anile treatment through an exposure to a solvent vapor in a solvent atmosphere or a heating.

Materials forming the electron extraction layer 15 include, but are not particularly limited to, a n-type semiconductor material.

Methods of forming the electron extraction layer but are not particularly limited to, a dry film forming method and a wet film forming method When forming electron extraction layer 15, it is preferably subjected to an anile treatment through an exposure to a solvent vapor in a solvent atmosphere or a heating.

The positive hole extraction layer 13 and the electron extraction layer 15 may not be formed.

EXAMPLES

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

Compounds are identified using an ion trap weight analyzer LCQ Fleet from Thermo Fisher Scientific, Inc.

Example 1

After 19 g (170 mmol) of t-BuOK and 70 mL of t-amylalcohol were placed in a 200 mL four-neck flask, the mixture was heated to be refluxed while stirred. Next, after a mixture of 10.9 g (100 mmol) of 2-cyanothiophene and 9.63 g (47.6 mmol) of diisopropyl succinate was gradually dropped therein, the mixture was refluxed for 3 hrs. Further, after the mixture was cooled to have a temperature of 70° C., 20 mL of ethylacetate and 20 mL of MeOH were added therein. Next, after the mixture was cooled to have room temperature, a precipitate was filtered with a glass filter. Further, the filtered material was washed with methanol for 3 times and dried by a vacuum drier to obtain 12.1 g (yield rate of 50.8%) of a red solid compound having the following formula (2-1). The compound having the formula (2-1) had a m/z of 301.01 ([M+H]$^+$).

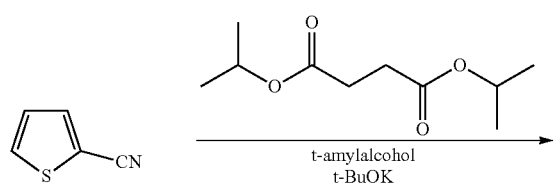

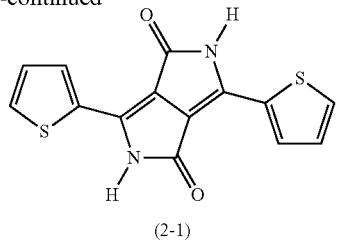

(2-1)

After 4.0 g (13.3 mmol) of the compound having the formula (2-1), 12.0 g (54.9 mmol) of di-tert-butyl dicarbonate, 200 mL of dry THF and 3.3 g (26.7 mmol) of dimethylaminopyridine (DMAP) were placed in a 500 mL egg-plant shaped flask, the mixture was stirred for 15 hrs. Next, after a solvent was removed from the mixture, 100 mL of MeOH were added thereto. Further, a precipitate was filtered, it was refined using silica gel column chromatography (solvent: dichloromethane) to obtain 3.6 g (yield rate of 54.1%) of a red powdery compound having the following formula (1-1). The compound having the formula (1-1) had a m/z of 501.01 ([M+H]$^+$).

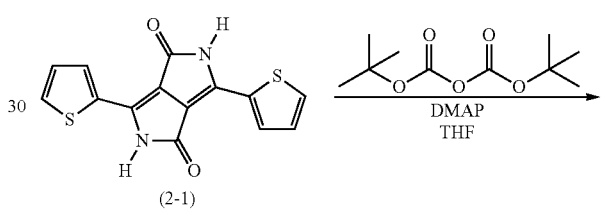

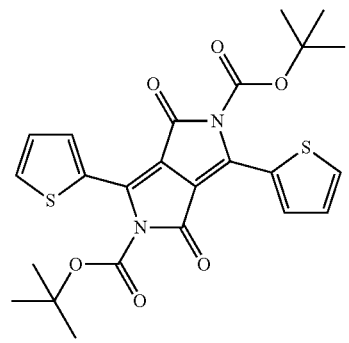

(1-1)

After 50 mg (0.10 mmol) of the compound having the formula (1-1) were placed in an aluminum pan, they were heated to have a temperature of 250° C. at 20° C./min and weight variation (TG) thereof was measured using a thermal analyzer EXSTRA6200 from Seiko Instruments, Inc. in a nitrogen atmosphere. Thus, 29 mg (yield rate quant.) of a dark purple solid compound having the formula (2-1) was obtained. The compound having the formula (2-1) had a m/z of 300.1 ([M+H]$^+$).

Figure 2:
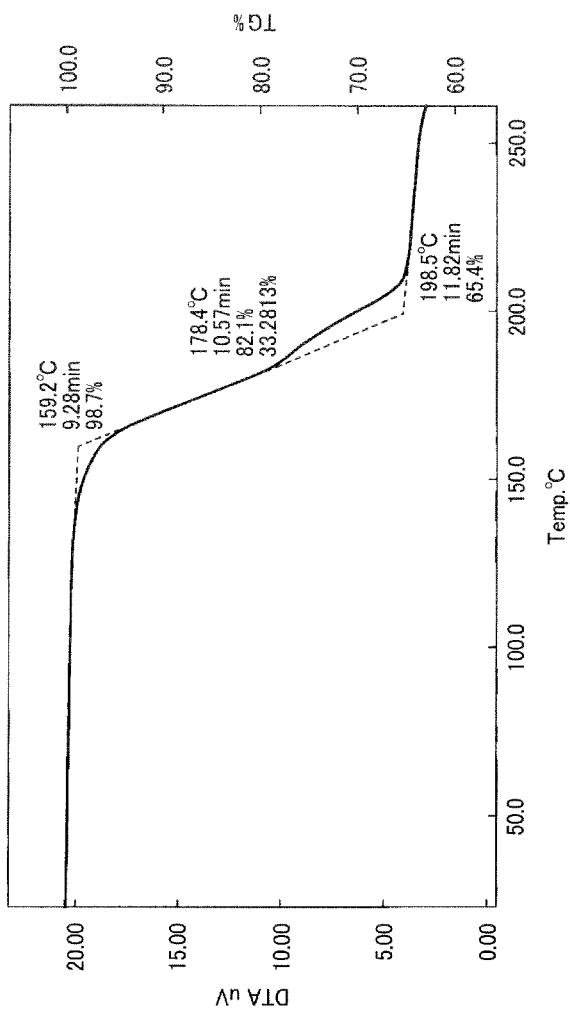
FIG. 2 is a diagram showing a measurement result of weight variation of a compound having the formula (1-1)

FIG. 2 is a diagram showing a measurement result of weight variation of the compound having the formula (1-1).

FIG. 2 shows a weight reduction by 34.6% from 150 to 220° C. This is almost equivalent to a weight (theoretical value of 40.0%) of t-butyloxycarbonyl group eliminated from the compound having the formula (1-1). This proves the compound having the formula (1-1) is converted into compound having the formula (2-1) with heat.

Example 2

After 3.0 g (6.0 mmol) of the compound having the formula (1-1), 2.5 g (13.8 mmol) of N-bromosuccinimide and 20 mL of chloroform were placed in a 500 mL egg-plant shaped flask, they were blinded and stirred for 12 hrs at 0° C. Next, after a solvent was removed from the mixture, 100 mL of MeOH was added thereto. Further, a precipitate was filtered to obtain 3.1 g (yield rate of 78.8%) of a dark green powdery compound having the following formula (1-4). The compound having the formula (1-4) had a mix of 658.9, 656.9 and 660.9 ([M+H]$^+$).

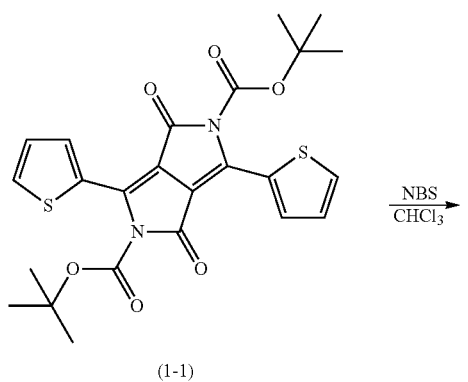

The procedure for measuring TG in Example 1 was repeated except for replacing 50 mg (0.10 mmol) of the compound having the formula (1-1) with 50 mg (0.076 mmol) of the compound having the formula (1-4) to obtain 34 mg (yield rate quant.) of a dark purple solid compound having the formula (2-4). The compound having the formula (2-4) had a mix of 658.9 ([M+H]$^+$).

Figure 3:
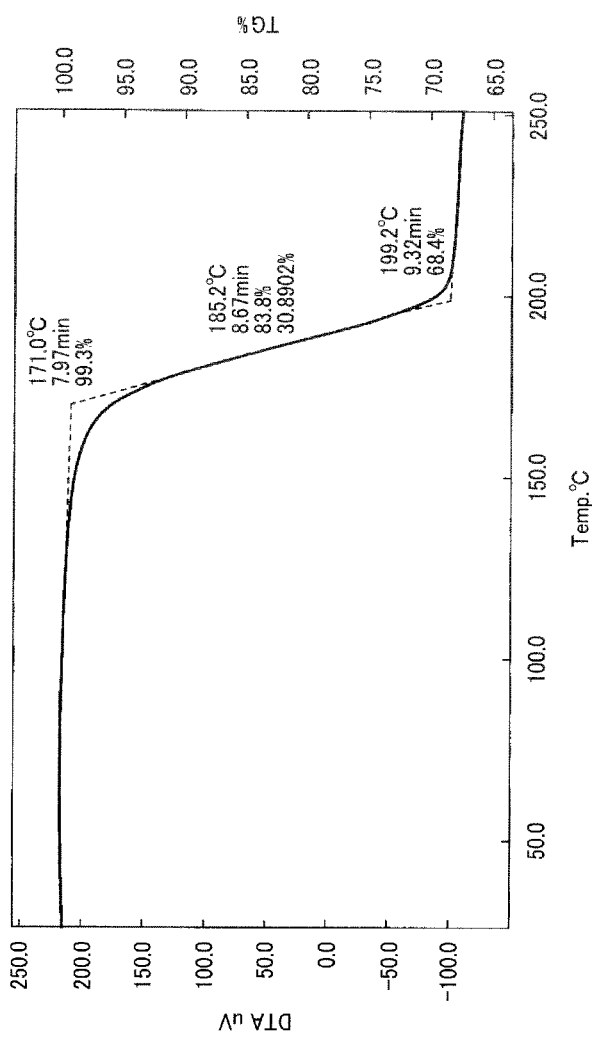
FIG. 3 is a diagram showing a measurement result of weight variation of a compound having the formula (1-4)

FIG. 3 is a diagram showing a measurement result of weight variation of the compound having the formula (1-4).

FIG. 3 shows a weight reduction by 31.6% from 140 to 220° C. This is almost equivalent to a weight (theoretical value of 30.5%) of t-butyloxycarbonyl group eliminated from the compound having the formula (1-4). This proves the compound having the formula (1-4) is converted into compound having the formula (2-4) with heat.

Example 3

After 400 mg (0.61 mmol) of the compound having the formula (1-4), 537 mg (1.83 mmol) of 5-hexyl-2-thiopheneboronic acid pinacol ester, 31 mg (6.09×10$^{-5}$ mol) of Pd (P-tBu$_3$)$_4$, 388 mg (1.83 mmol) of K$_3$PO$_4$, 10 mL of THF and 2 mL of water were placed in a 100 ml four-neck flask, the mixture was refluxed for 5 hrs in an Ar atmosphere. Next, after the mixture was cooled to have room temperature, it was added to 100 mL of methanol to extract a precipitate. Further, a precipitate was filtered, it was refined using silica gel column chromatography (solvent: dichloromethane) to obtain 250 mg (yield rate of 49.4%) of a dark blue powdery compound having the following formula (1-12). The compound having the formula (1-12) had a m/z of 833.3 ([M+H]$^+$).

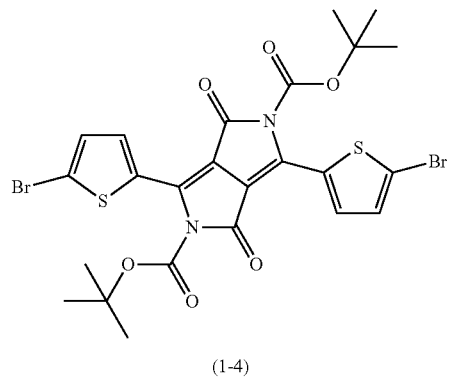

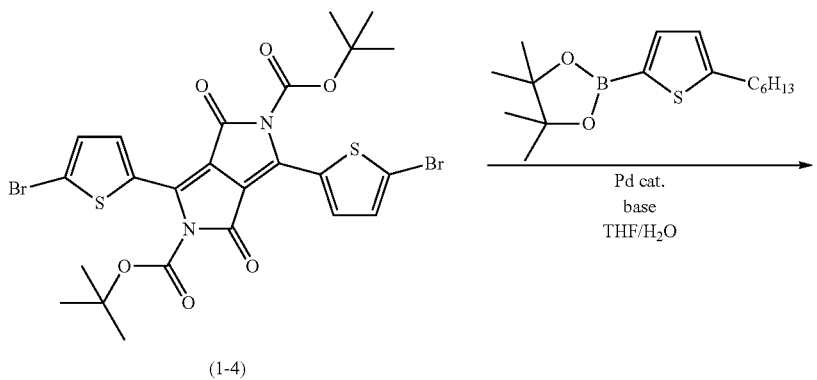

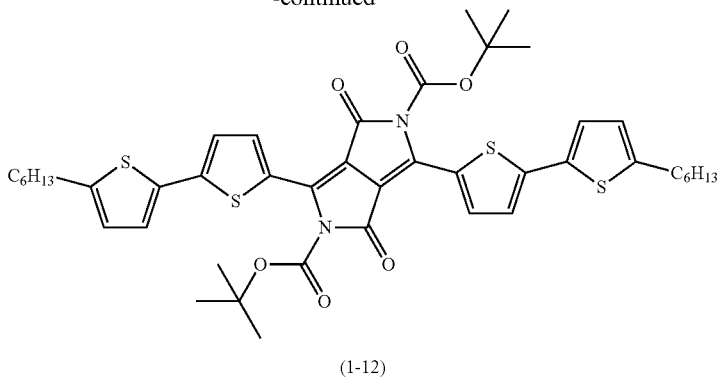

(1-12)

The procedure for measuring TG in Example 1 was repeated except for replacing 50 mg (0.10 mmol) of the compound having the formula (1-1) with 50 mg (0.060 mmol) of the compound having the formula (1-12) to obtain 34 mg (yield rate quant.) of a dark blue solid compound having the formula (2-12). The compound having the formula (2-12) had a m/z of 633.3 ([M+H]$^+$).

Figure 4:
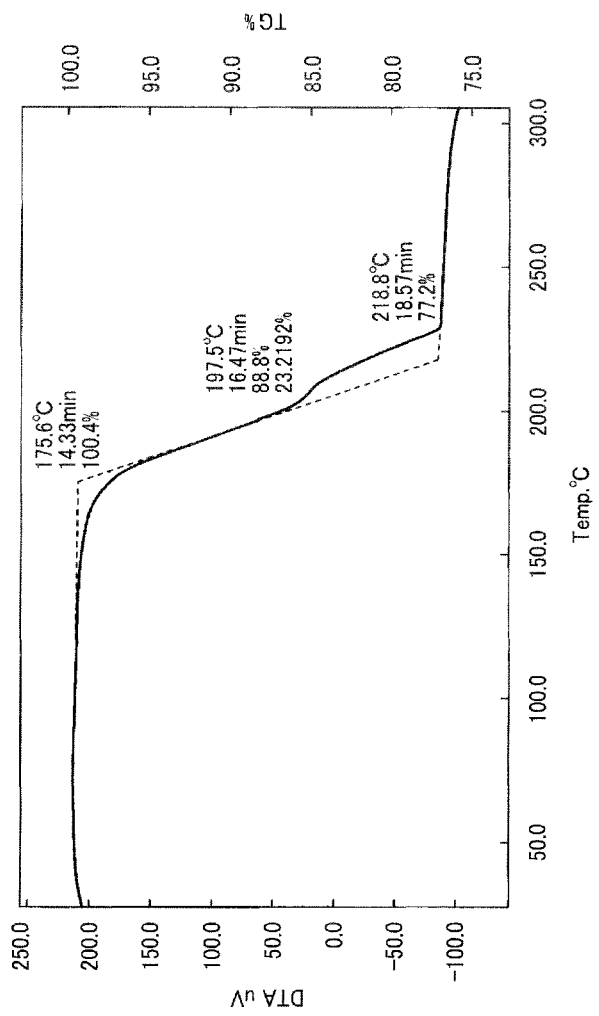
FIG. 4 is a diagram showing a measurement result of weight variation of a compound having the formula (1-12)

FIG. 4 is a diagram showing a measurement result of weight variation of the compound having the formula (1-12).

FIG. 4 shows a weight reduction by 23.8% from 140 to 220° C. This is almost equivalent to a weight (theoretical value of 24.0%) of t-butyloxycarbonyl group eliminated from the compound having the formula (1-12). This proves the compound having the formula (1-12) is converted into compound having the formula (2-12) with heat.

Example 4

After 400 mg (0.61 mmol) of the compound having the formula (1-4), 690 mg (1.83 mmol) of 5'-hexyl-2,2'-bithiophene-5-boronic acid pinacol ester, 31 mg (6.09×10$^{-5}$ mol) of Pd (P-tBu$_3$)$_4$, 388 mg (1.83 mmol) of K$_3$PO$_4$, 10 mL of THF and 2 mL of water were placed in a 100 ml four-neck flask, the mixture was refluxed for 5 hrs in an Ar atmosphere. Next, after the mixture was cooled to have room temperature, it was added to 100 mL of methanol to extract a precipitate. Further, a precipitate was filtered, it was refined using silica gel column chromatography (solvent: dichloromethane) to obtain 310 mg (yield rate of 50.9%) of a dark blue powdery compound having the following formula (1-16). The compound having the formula (1-16) had a m/z of 999.4 ([M+H]$^+$).

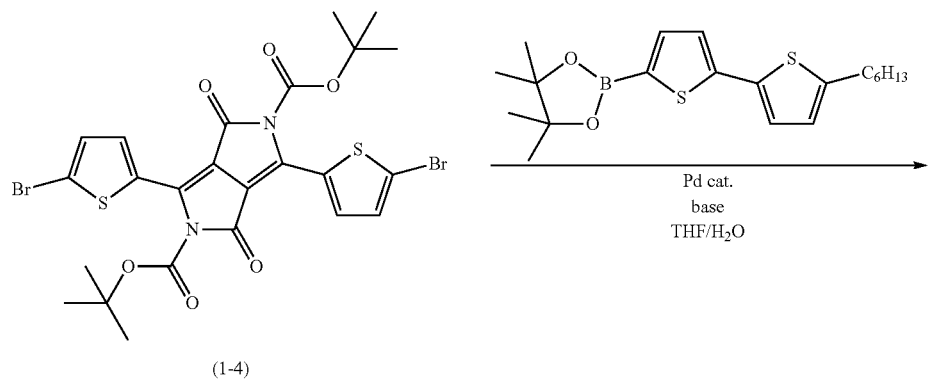

(1-4)

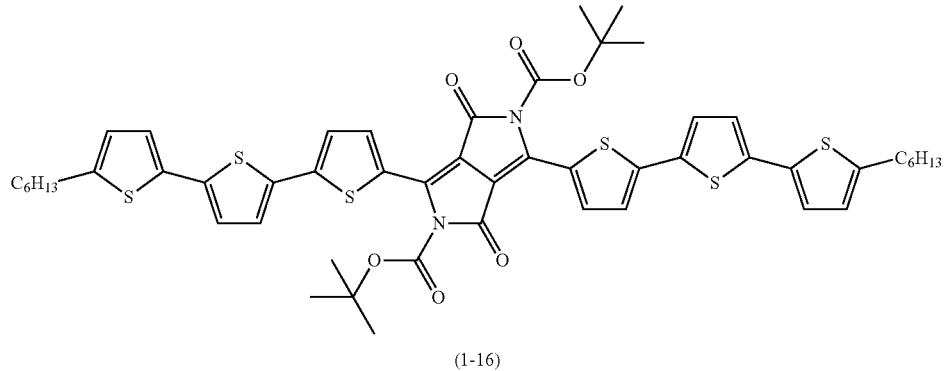

(1-16)

The procedure for measuring TG in Example 1 was repeated except for replacing 50 mg (0.10 mmol) of the compound having the formula (1-1) with 50 mg (0.050 mmol) of the compound having the formula (1-16) to obtain 39 mg (yield rate quant.) of a dark blue solid compound having the formula (2-16). The compound having the formula (2-16) had a m/z of 799.3 ([M+H]$^+$).

Figure 5:
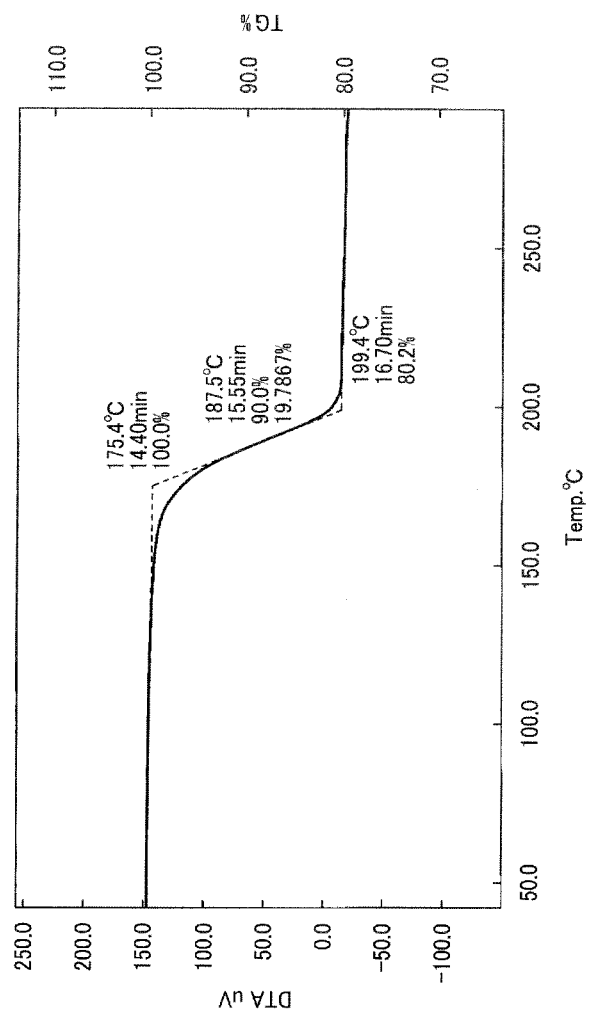
FIG. 5 is a diagram showing a measurement result of weight variation of a compound having the formula (1-16)

FIG. 5 is a diagram showing a measurement result of weight variation of the compound having the formula (1-16).

FIG. 5 shows a weight reduction by 19.8% from 150 to 210° C. This is almost equivalent to a weight (theoretical value of 20.0%) of t-butyloxycarbonyl group eliminated from the compound having the formula (1-16). This proves the compound having the formula (1-16) is converted into compound having the formula (2-16) with heat.

Example 5

After 7.44 g (30.24 mmol) of 3,4,5-trimethoxy-1-bromobenzene and 70 mL of dichloromethane were placed in a four-neck flask, the mixture was cooled to have a temperature of −78° C. Next, after 25.0 g (99.8 mmol) of BBr$_3$ were gradually dropped in the mixture, it was stirred for 1 hr. Further, after the mixture is heated to have room temperature, it was added to 200 mL of iced water to extract a precipitate. Next, the precipitate was filtered to obtain 6.8 g (yield rate quant.) of a white powder 3,4,5-hydroxy-1-bromobenzene. 3,4,5-hydroxy-1-bromobenzene had a m/z of 206.01 ([M+H]$^+$).

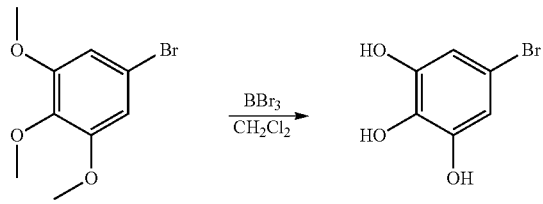

After 3.0 g (14.7 mmol) of 3,4,5-trimethoxy-1-bromobenzene, 14.6 g (58.9 mmol) of 1-bromododecane, dry DMF and 10.2 g (73.5 mmol) of potassium carbonate were placed in a four-neck flask, the mixture was stirred all night at 70° C. Next, after the mixture was cooled to have room temperature, it was extracted using a mixed solvent including toluene and water. Further, after a toluene layer was dried using magnesium sulfate, the mixture was filtered. Next, after a solvent was removed under reduced pressure, a rude product was refined using a silica gel column chromatography (solvent: toluene/n-hexane=1/1) to obtain 8.0 g (yield rate of 77%) of a white powder 3,4,5-tridodesiloxy-1-bromobenzene having the following formula. 3,4,5-tridodesiloxy-1-bromobenzene had a m/z of 709.5 and 711.5 ([M+H]$^+$).

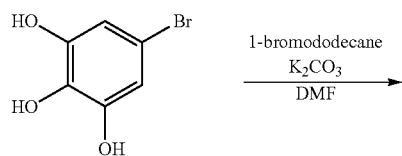

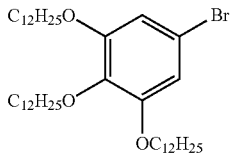

After 0.57 g (4.45 mmol) of 2-thiophene boronic acid, 3.0 g (4.24 mmol) of 3,4,5-tridodesiloxy-1-bromobenzene, 20 mL of THF, 8 mL of an aqueous solution including K$_3$PO$_4$ in an amount of 20% by weight and 0.11 g (0.22 mmol) of Pd (P-tBu$_3$)$_4$ were placed in a four-neck flask, the mixture was refluxed for 4 hrs. Next, after the mixture was cooled to have room temperature, it was extracted using a mixed solvent including ethylacetate and water. Further, after an ethyl layer was dried using magnesium sulfate, the mixture was filtered. Next, after a solvent was removed under reduced pressure, a rude product was refined using a silica gel column chromatography (solvent:n-hexane/ethylacetate=1/1 (volume ratio)) to obtain 2.55 g (yield rate of 80.4%) of a white powder 2-(3,4,5-tridodesiloxyphenyl)thiophene.

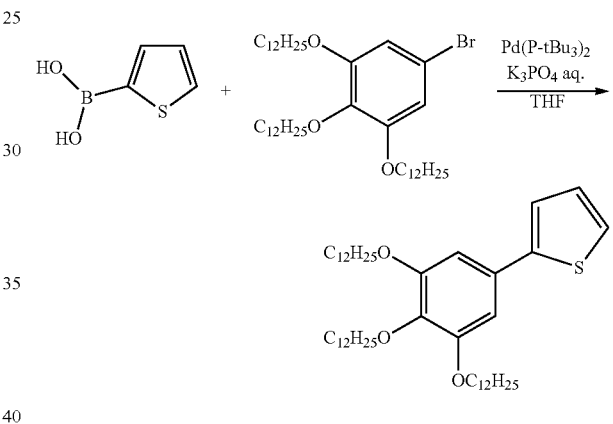

After 1.2 g (1.68 mmol) of 2-(3,4,5-tridodesiloxyphenyl) thiophene and 50 mL of dry THF were placed in a four-neck flask, the mixture was cooled to have a temperature of −40° C. Next, after 1.0 mL (2.52 mmol) of n-butyl lithium was gradually dropped in the mixture, 0.4 g (2.02 mmol) of trimethyl tin chloride were added thereto. Further, after the mixture was heated to have room temperature, it was extracted using a mixed solvent including ethylacetate and an aqueous solution including potassium fluoride in an amount of 10% by weight. Next, after an ethylacetate layer was dried using magnesium sulfate, the mixture was filtered. Further, a solvent was removed under reduced pressure to obtain 2.3 g (yield rate quant.) of a faint yellow liquid 2-(trimethyl tin)-5-(3,4,5-tridodesiloxyphenyl)thiophene. 2-(trimethyl tin)-5-(3,4,5-tridodesiloxyphenyl)thiophene had a m/z of 877.5 ([M+H]$^+$).

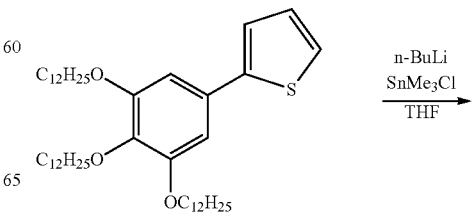

-continued

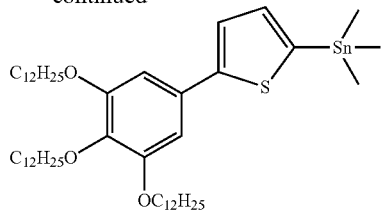

After 1.2 g of 2-(trimethyl tin)-5-(3,4,5-tridodesiloxyphenyl)thiophene, 0.42 g (0.65 mmol) of the compound having the formula (1-4) and 66 mg (0.55 mmol) of Pd(PPh$_3$)$_4$ were placed in a four-neck flask, the mixture was refluxed for 4 hrs in an Ar atmosphere. Next, after the mixture was cooled to have room temperature, it was extracted using a mixed solvent including ethylacetate and an aqueous solution including potassium fluoride in an amount of 10% by weight. Further, after an ethyl layer was dried using magnesium sulfate, the mixture was filtered. Next, after a solvent was removed under reduced pressure, a rude product was refined using a silica gel column chromatography (solvent:n-hexane/ethylacetate =8/2 (volume ratio)) to obtain 320 mg (yield rate of 31%) of a blue solid compound having the formula (1-25). The compound having the formula (1-25) had a m/z of 1924.2 ([M+H]$^+$).

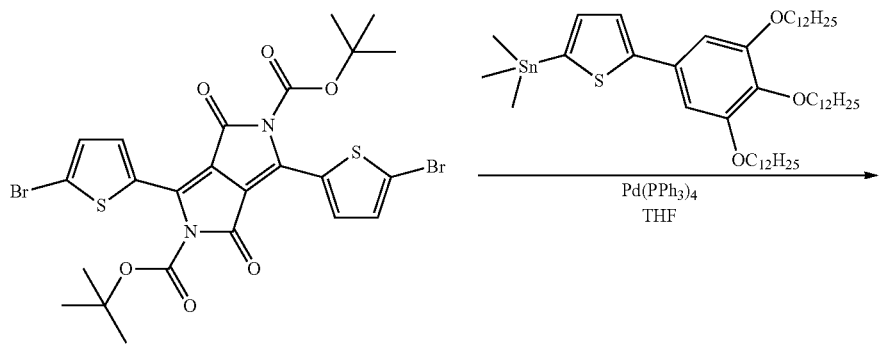

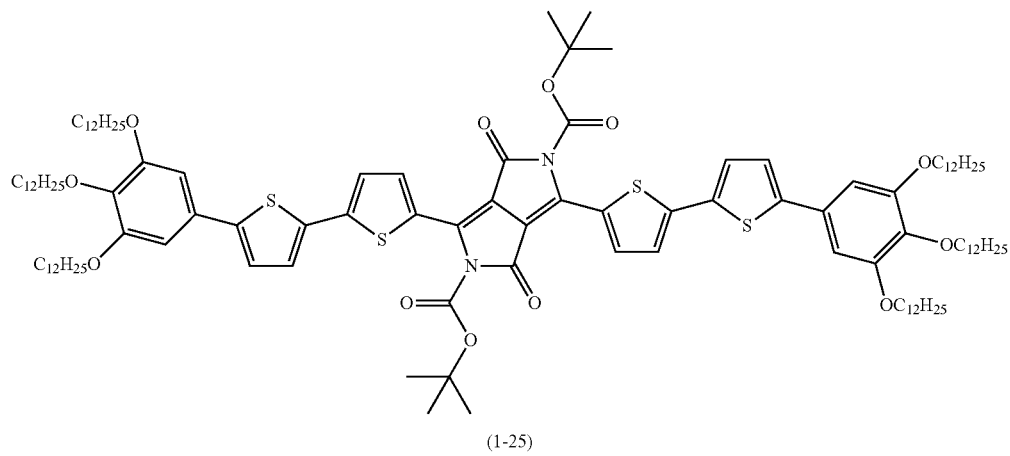

(1-25)

The procedure for measuring TG in Example 1 was repeated except for replacing 50 mg (0.10 mmol) of the compound having the formula (1-1) with 50 mg (0.050 mmol) of the compound having the formula (1-25) to obtain 44 mg (yield rate quant.) of a dark blue solid compound having the formula (2-25). The compound having the formula (2-25) had a m/z of 1723.2 ([M+H]$^+$).

Figure 6:
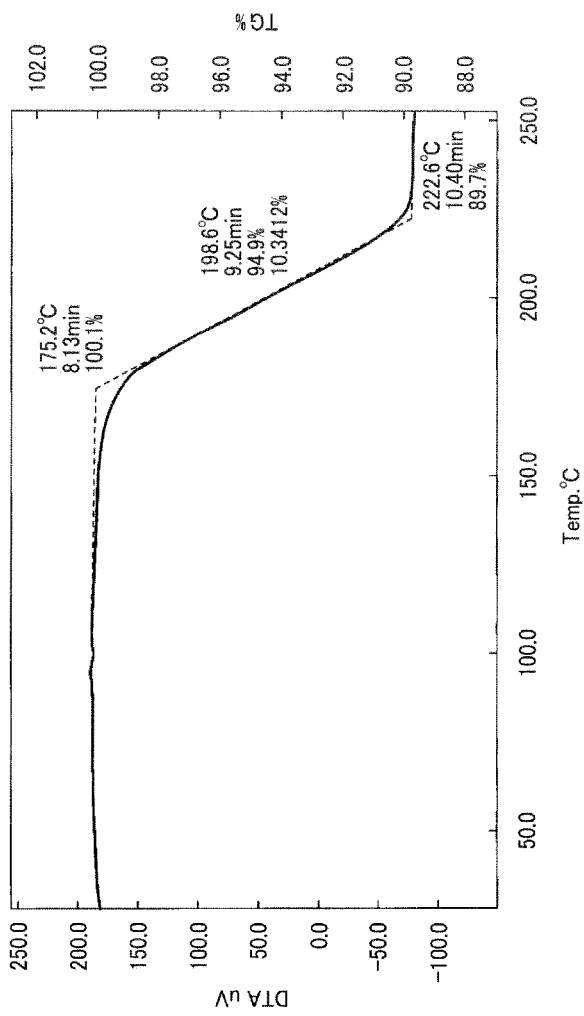
FIG. 6 is a diagram showing a measurement result of weight variation of a compound having the formula (1-25)

FIG. 6 is a diagram showing a measurement result of weight variation of the compound having the formula (1-25).

FIG. 5 shows a weight reduction by 10.3% from 90 to 220° C. This is almost equivalent to a weight (theoretical value of 10.4%) of t-butyloxycarbonyl group eliminated from the compound having the formula (1-25). This proves the compound having the formula (1-25) is converted into compound having the formula (2-25) with heat.

Example 6

The procedure for preparation of 2-(3,4,5-tridodesiloxyphenyl)thiophene in Example 5 was repeated except for replacing 0.57 g (4.45 mmol) of 2-thiophene boronic acid with 4.45 mmol of 5-(4,4,5,5-tetramethyl-1,3,2-diocaborolan-2-yl)-2,2'-bithiophene to obtain 3.1 g (yield rate quant.) of a faint yellow solid 5-(3,4,5-tridodesiloxyphenyl)-2,2'-bithiophene. 5-(3,4,5-tridodesiloxyphenyl)-2,2'-bithiophene had a m/z of 795.6 ([M+H]$^+$).

The procedure for preparation of 2-(trimethyl tin)-5-(3,4,5-tridodesiloxyphenyl)thiophene in Example 5 was repeated except for replacing 12 g (1.68 mmol) of 2-(3,4,5-tridodesiloxyphenyl)thiophene with 1.68 mmol of 5-(3,4,5-tridodesiloxyphenyl)-2,2'-bithiophene to obtain 2.37 g (yield rate quant.) a faint yellow liquid 5-(3,4,5-tridodesiloxyphenyl)-5'-(trimethyl tin)-2,2'-bithiophene. 5-(3,4,5-tridodesiloxyphenyl)-5'-(trimethyl tin)-2,2'-bithiophene had a m/z of 959.5 ([M+H]$^+$).

The procedure for preparation of the compound having the formula (1-25) in Example 5 was repeated except for replacing 1.2 g of 2-(trimethyl tin)-5-(3,4,5-tridodesiloxyphenyl)thiophene with 1.4 g of 5-(3,4,5-tridodesiloxyphenyl)-5'-(trimethyl tin)-2,2'-bithiophene to obtain 130 mg (yield rate of 13.6%) a dark blue solid compound having the formula (1-27). The compound having the formula (1-27) had a m/z of 2087.2 ([M+H]$^+$).

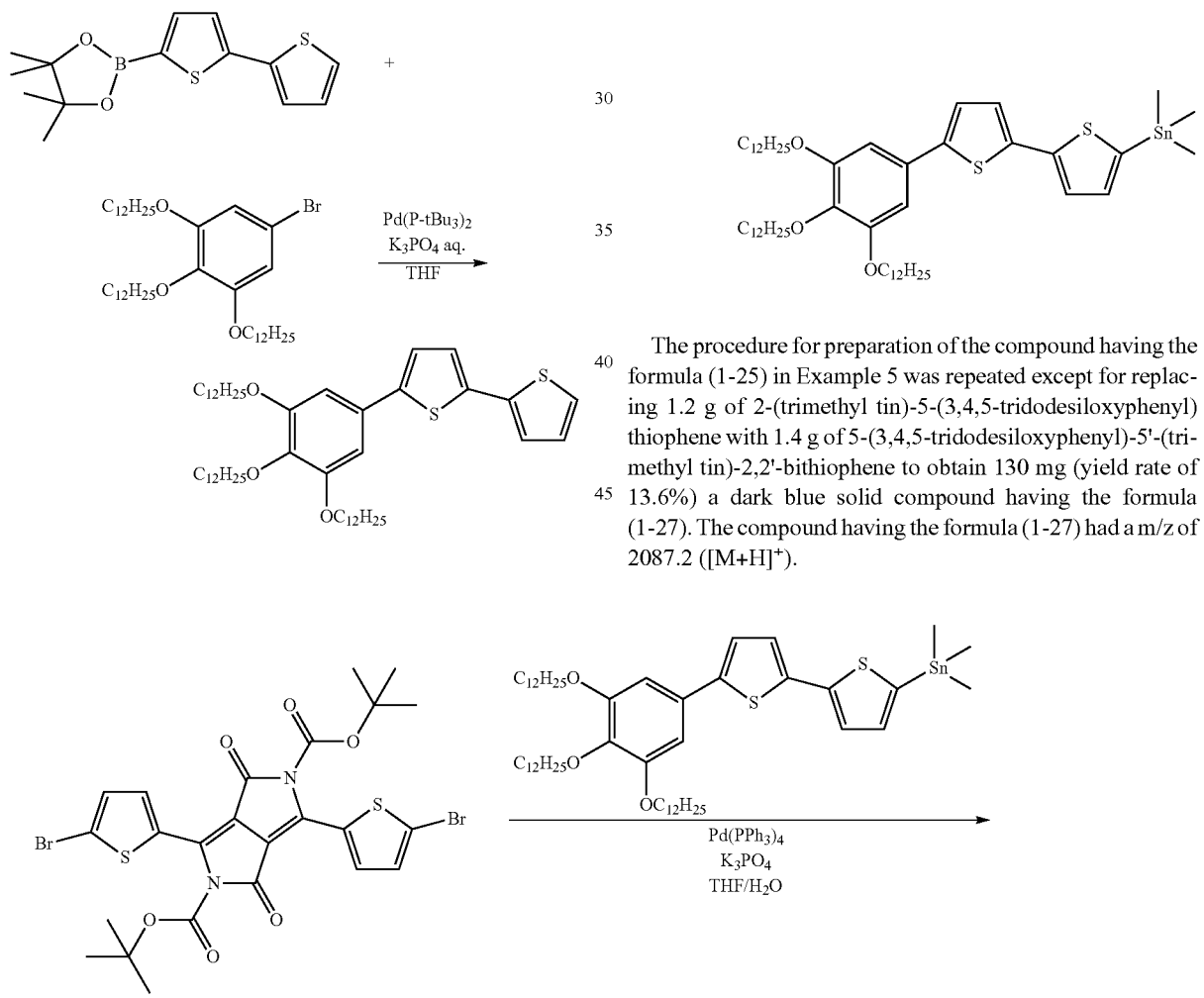

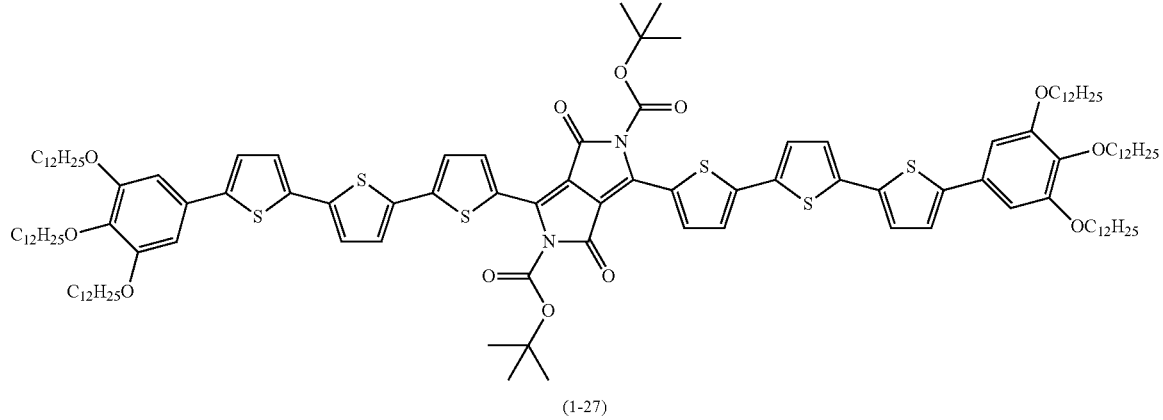

(1-27)

The procedure for measuring TG in Example 1 was repeated except for replacing 50 mg (0.10 mmol) of the compound having the formula (1-1) with 50 mg (0.024 mmol) of the compound having the formula (1-27) to obtain 44 mg (yield rate quant.) of a dark blue solid compound having the formula (2-27). The compound having the formula (2-27) had a m/z of 1886.2 ([M+H]$^+$).

Figure 7:
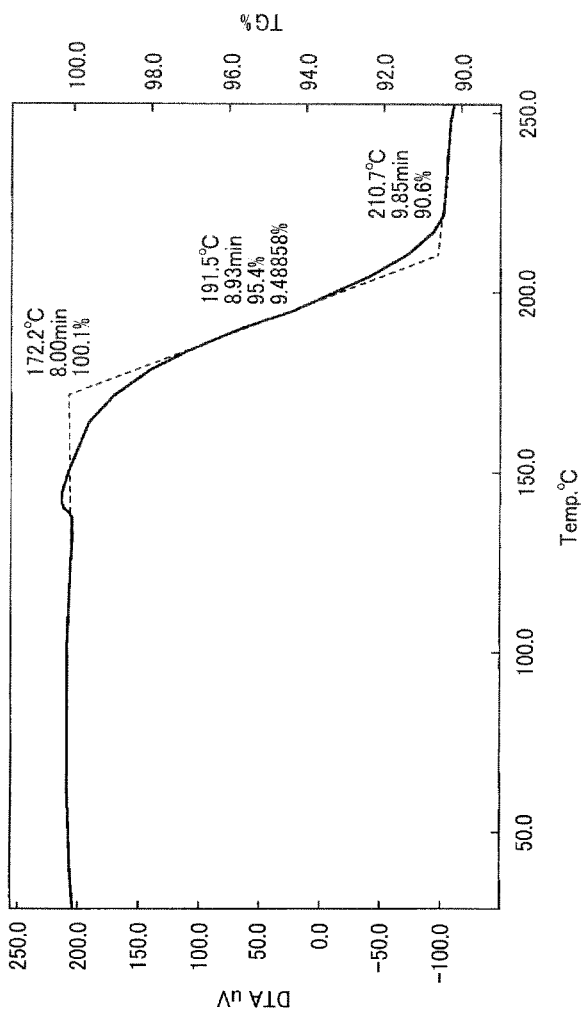
FIG. 7 is a diagram showing a measurement result of eight variation of a compound having the formula (1-27)

FIG. 7 is a diagram showing a measurement result of weight variation of the compound having the formula (1-27).

FIG. 7 shows a weight reduction by 9.4% from 140 to 220° C. This is almost equivalent to a weight (theoretical value of 9.6%) of t-butyloxycarbonyl group eliminated from the compound having the formula (1-27). This proves the compound having the formula (1-27) is converted into compound having the formula (2-27) with heat.

Example 7

The procedure for preparation of the compound having the formula (1-16) in Example 4 was repeated except for replacing 690 mg (1.83 mmol) of 5'-hexyl-2,2-bithiophene-5-boronic acid pinacol ester with 1.83 mmol of 4-hexyloxy-phnel boronic acid to obtain 500 mg (yield rate of 78%) a dark purple solid compound having the formula (1-18). The compound having the formula (1-18) had a m/z of 853.3 ([M+H]$^+$).

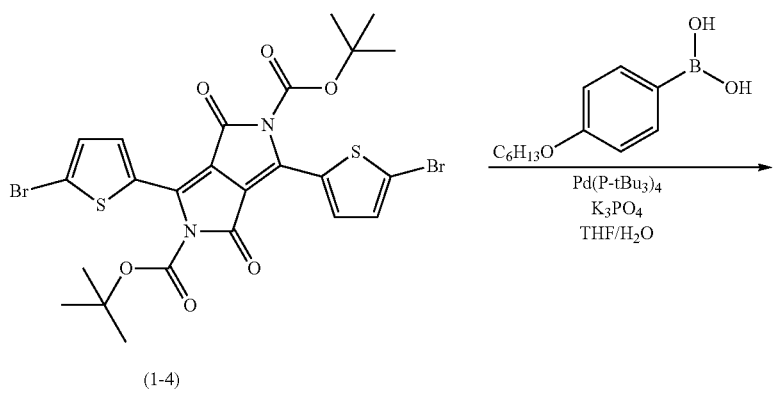

(1-4)

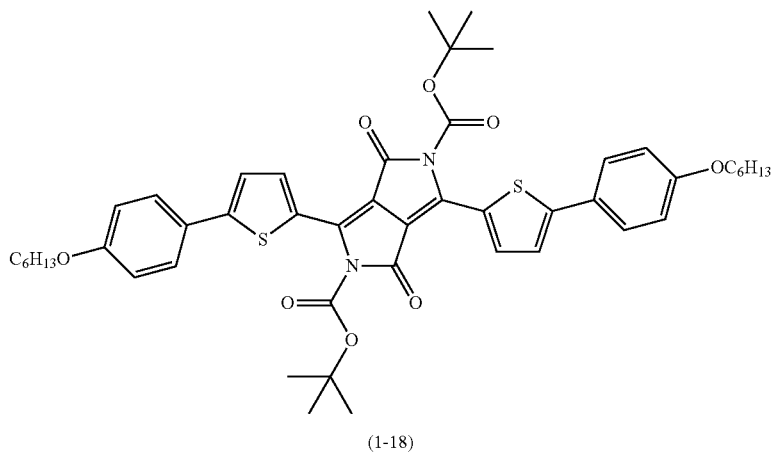

(1-18)

The procedure for measuring TG in Example 1 was repeated except for replacing 50 mg (0.10 mmol) of the compound having the formula (1-1) with 50 mg of the compound having the formula (1-17) to obtain 30 mg (yield rate quant.) of a solid compound having the formula (2-18).

Figure 8:
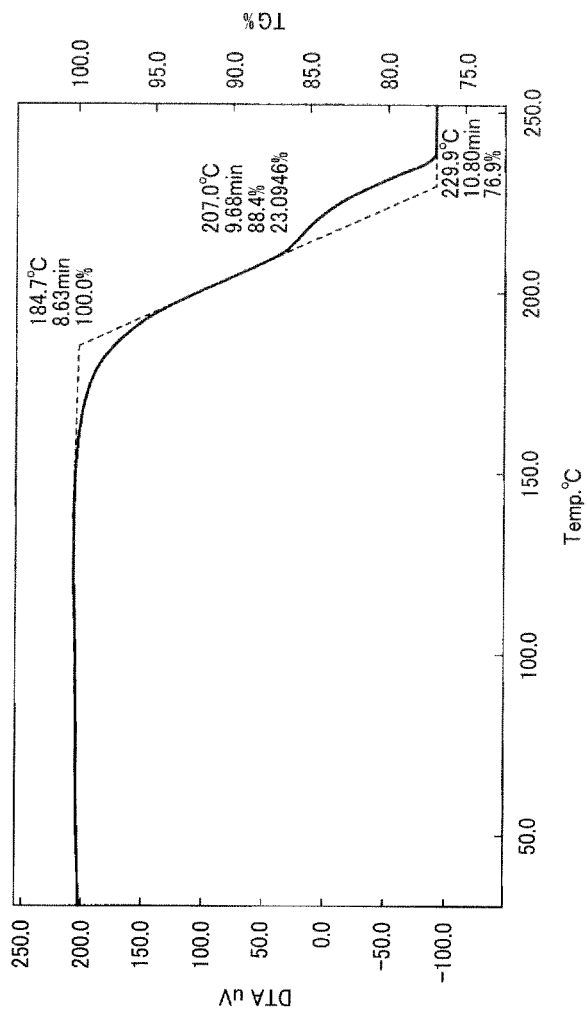
FIG. 8 is a diagram showing a measurement result of weight variation of a compound having the formula (1-18)

FIG. 8 is a diagram showing a measurement result of weight variation of the compound having the formula (1-18).

FIG. 8 shows a weight reduction by 23.1% from 184 to 230° C. This is almost equivalent to a weight (theoretical value of 23.5%) of t-butyloxycarbonyl group eliminated from the compound having the formula (1-18). This proves the compound having the formula (1-18) is converted into compound having the formula (2-18) with heat.

Example 8

The procedure for preparation of the compound having the formula (1-16) in Example 4 was repeated except for replacing 690 mg (1.83 mmol) of 5'-hexyl-2,2'-bithiophene-5-boronic acid pinacol ester with 1.83 mmol of 4-hexyl-2-thiophene boronic acid pinacol ester to obtain 410 mg (yield rate of 65%) a blue solid compound having the formula (1-18). The compound having the formula (1-17) had a m/z of 833.3 ([M+H]$^+$).

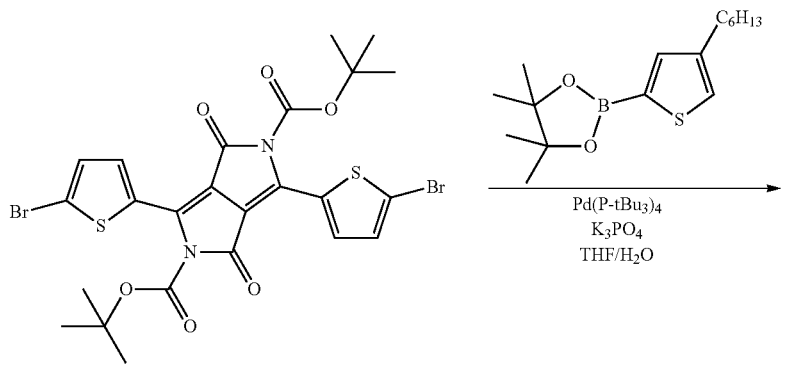

(1-4)

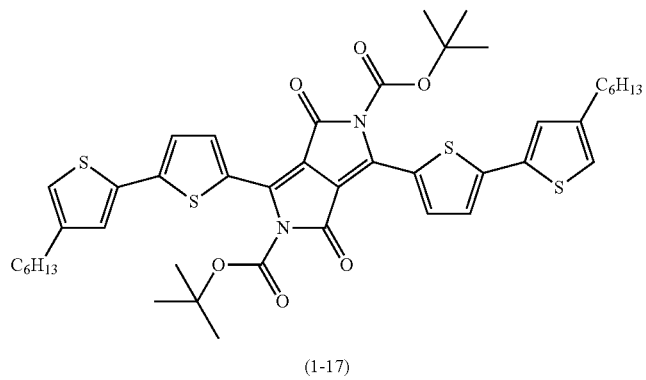

(1-17)

The procedure for measuring TG in Example 1 was repeated except for replacing 50 mg (0.10 mmol) of the compound having the formula (1-1) with 50 mg of the compound having the formula (1-17) to obtain 37 mg (yield rate quant.) of a dark purple solid compound having the formula (2-17). The compound having the formula (2-17) had a m/z of 633.3 ([M+H]$^+$).

Figure 9:
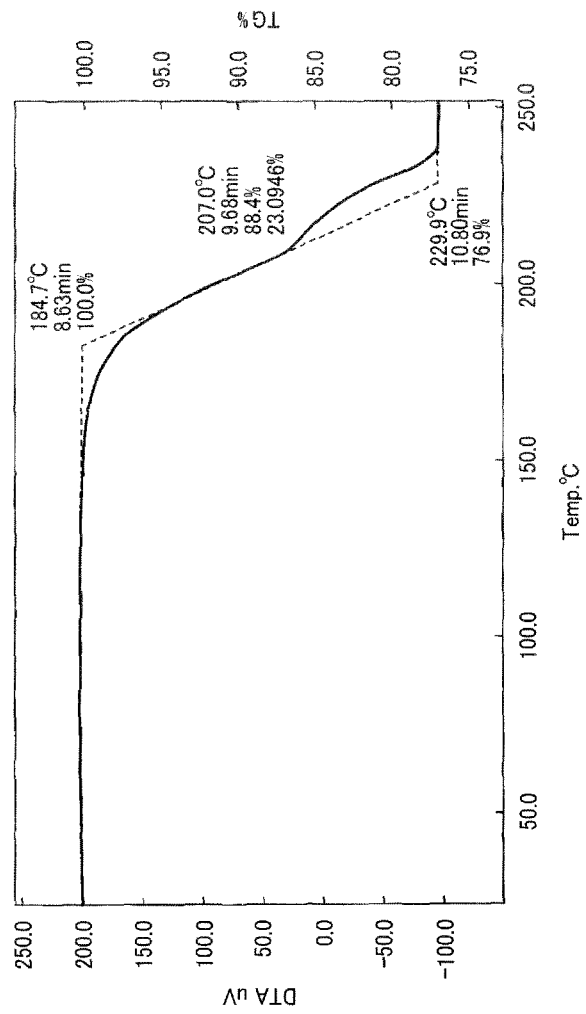
FIG. 9 is a diagram showing a measurement result of weight variation of a compound having the formula (1-17).

FIG. 9 is a diagram showing a measurement result of weight variation of the compound having the formula (1-7).

FIG. 9 shows a weight reduction by 23.1% from 170 to 230° C. This is almost equivalent to a weight (theoretical value of 24.0%) of t-butyloxycarbonyl group eliminated from the compound having the formula (1-17). This proves the compound having the formula (1-17) is converted into compound having the formula (2-17) with heat.

Next, solubilities of the compounds having the formulae (1-1), (1-4), (1-12), (1-16), (1-25), (1-27), (1-18) and (1-17), and the compounds converted therefrom respectively, having the formulae (2-1), (2-4), (2-12), (2-16), (2-25), (2-27), (2-18) and (2-17) were measured.

[Solubility]

After the compound was added to 2.0 mg of an organic solvent such as toluene, THF and chloroform until insoluble residue remained, the mixture was stirred for 10 min while the organic solvent was refluxed with heat. Next, after the mixture was cooled to have a temperature of 25° C., it was stirred for 1 hr. Further, after quietly put for 16 hrs, the top clear layer of the mixture was filtered through a PTFE filter having a hole diameter of 0.2 μm to prepare a saturated solution. Next, the solution was dried under reduced pressure and the solubility of the compound in an organic solvent was measured. The evaluation standard of the solubility of the compound in an organic solvent is as follows.

Excellent: not less than 0.5% by weight
Good: not less than 0.1% and less than 0.5% by weight
Fair: not less than 0.005% and less than 0.1% by weight
Poor: less than 0.005% by weight The evaluation results of the solubilities of the compounds in an organic solvent are shown in Table 1

TABLE 1

| Formulae | THF | Toluene | CHCl$_3$ |
|---|---|---|---|
| (1-1) | Excellent | Excellent | Excellent |
| (1-4) | Excellent | Good | Excellent |
| (1-12) | Good | Excellent | Excellent |
| (1-16) | Excellent | Excellent | Excellent |
| (1-25) | Excellent | Excellent | Excellent |
| (1-27) | Good | Good | Excellent |
| (1-18) | Excellent | Excellent | Excellent |
| (1-17) | Excellent | Excellent | Excellent |
| (2-1) | Poor | Poor | Poor |
| (2-4) | Poor | Poor | Poor |
| (2-12) | Poor | Poor | Poor |
| (2-16) | Poor | Poor | Poor |
| (2-25) | Poor | Poor | Poor |
| (2-27) | Poor | Poor | Poor |
| (2-18) | Poor | Poor | Poor |
| (2-17) | Poor | Poor | Poor |

Table 1 proves that the compounds having the formulae (1-1), (1-4), (1-12), (1-16), (1-25), (1-27), (1-18) and (1-17) are soluble in toluene, THF and chloroform.

To the contrary, it proves that the compounds having the formulae (2-1), (2-4), (2-12), (2-16), (2-25), (2-27), (2-18) and (2-17) converted from the above compounds respectively, are insoluble in toluene, THF and chloroform because a t-butyloxycarbonyl group was eliminated from each of the above compounds.

Consequently, the compounds having the formulae (1-1), (1-4), (1-12), (1-16), (1-25), (1-27), (1-18) and (1-17) are proved to be soluble in toluene, THF and chloroform, and can be converted into the compounds having the formulae (2-1), (2-4), (2-12), (2-16), (2-25), (2-27), (2-18) and (2-17) at a high yield rate, respectively.

Having now fully described the invention, it will be apparent to one of ordinary skill in the art that many changes and modifications can be made thereto without departing from the spirit and scope of the invention as set forth therein.

What is claimed is:

1. A solution, comprising:

an organic solvent; and a compound dissolved in the organic solvent, having the following formula (1):

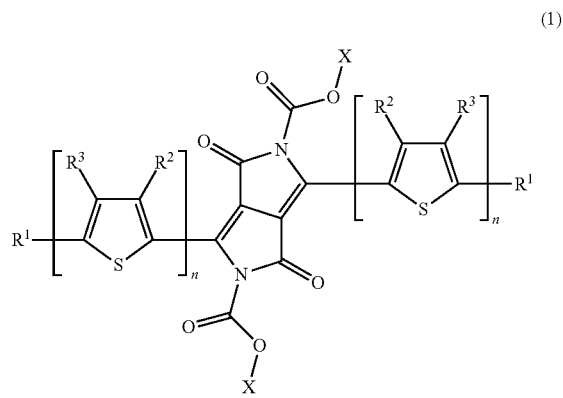

(1)

wherein $R^2$ and $R^3$ independently represent an alkyl group which may have a substituent, an alkoxy group which may have a substituent, an alkylthio group which may have a substituent or a hydrogen atom, and may form a ring together; X represents an alkyl group having 4 to 6 carbon atoms, which may have a substituent; and n represents 1, 2 or 3, and wherein $R^1$ represents a group having the following formula:

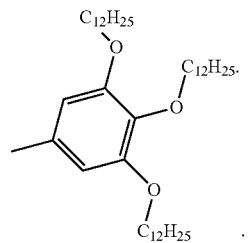

2. The solution of claim 1, wherein each of $R^2$ and $R^3$ represents a hydrogen atom.

3. The solution of claim 1, wherein n represents 1 or 2.

4. An organic semiconductor material formed by applying an energy to a compound having the following formula (1):

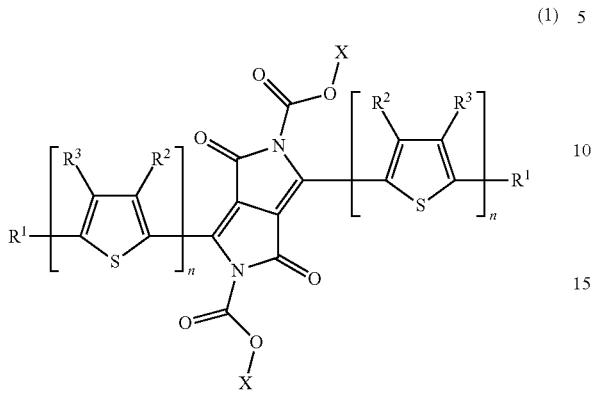

wherein $R^2$ and $R^3$ independently represent an alkyl group which may have a substituent, an alkoxy group which may have a substituent, an alkylthio group which may have a substituent or a hydrogen atom, and may form a ring together; X represents an alkyl group having 4 to 6 carbon atoms, which may have a substituent; and n represents 1, 2 or 3, comprising a compound having the following formula (2):

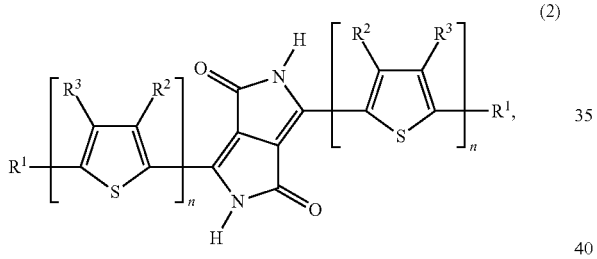

wherein $R^1$ represents a group having the following formula:

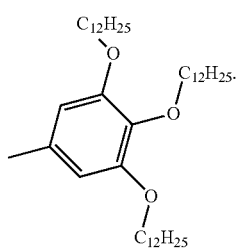

5. An organic semiconductor film, formed by coating the solution according to claim 1 to form a film and applying an energy thereto, comprising a compound having the following formula (2):

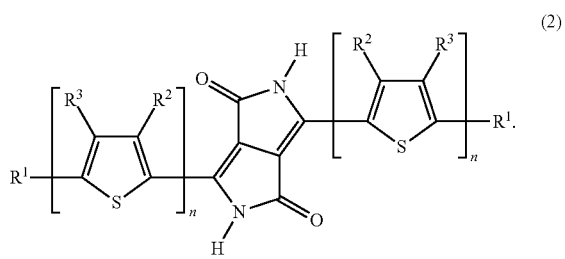

6. An electronic device, comprising the organic semiconductor film according to claim 5.

7. An electronic equipment, comprising the electronic device according to claim 6.

* * * * *